(12) United States Patent
Joe

(10) Patent No.: US 12,125,541 B2
(45) Date of Patent: Oct. 22, 2024

(54) METHOD OF PROGRAMMING NON-VOLATILE MEMORY DEVICE

(71) Applicant: SAMSUNG ELECTRONICS CO., LTD., Suwon-si (KR)

(72) Inventor: Sungmin Joe, Seoul (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 17/852,057

(22) Filed: Jun. 28, 2022

(65) Prior Publication Data

US 2023/0145681 A1 May 11, 2023

(30) Foreign Application Priority Data

Nov. 10, 2021 (KR) .......... 10-2021-0154282
Jan. 14, 2022 (KR) .......... 10-2022-0005911

(51) Int. Cl.
*G11C 16/10* (2006.01)
*G11C 16/08* (2006.01)
*G11C 16/20* (2006.01)
*G11C 16/26* (2006.01)

(52) U.S. Cl.
CPC .......... *G11C 16/102* (2013.01); *G11C 16/08* (2013.01); *G11C 16/20* (2013.01); *G11C 16/26* (2013.01)

(58) Field of Classification Search
CPC ...................................................... G11C 7/12
See application file for complete search history.

(56) References Cited

U.S. PATENT DOCUMENTS

| | | | |
|---|---|---|---|
| 7,433,241 B2 | 10/2008 | Dong et al. | |
| 7,577,026 B2 | 8/2009 | Dong et al. | |
| 3,027,208 A1 | 9/2011 | Kim | |
| 8,194,455 B2 | 6/2012 | Oh et al. | |
| 8,027,208 B2 | 5/2019 | Lee | |
| 10,998,337 B2 | 5/2021 | Nishikawa et al. | |
| 11,367,493 B2 * | 6/2022 | Kim .................. | G11C 16/3418 |
| 2008/0159004 A1 | 7/2008 | Hemink et al. | |
| 2008/0278999 A1 | 11/2008 | Dong et al. | |
| 2013/0016562 A1 * | 1/2013 | Mun .................. | G11C 11/5628 |
| | | | 365/185.12 |
| 2013/0064029 A1 * | 3/2013 | Park .................. | G11C 16/0483 |
| | | | 365/203 |

(Continued)

OTHER PUBLICATIONS

European Search Report Dated Mar. 20, 2023, Cited in EP Patent Application No. 22188661.7.

*Primary Examiner* — Douglas King
(74) *Attorney, Agent, or Firm* — Fish & Richardson P.C.

(57) ABSTRACT

A method of programming a non-volatile memory device may include; during a first channel initialization period, applying a first voltage to a selected word line and a first word line group proximate to the selected word line, and applying a second voltage lower than the first voltage to a second word line group distal from the selected word line, applying a first program voltage to the selected word line during a first program execution period in order to perform a first program operation for data, during a second channel initialization period, applying the first voltage to the selected word line and the first word line group, and applying the second voltage to the second word line group, and applying a second program voltage to the selected word line during a second program execution period in order to perform a second program operation for the data.

13 Claims, 28 Drawing Sheets

(56) References Cited

U.S. PATENT DOCUMENTS

| | | | |
|---|---|---|---|
| 2019/0156904 A1* | 5/2019 | Hong | G11C 16/10 |
| 2019/0325935 A1 | 10/2019 | Lee | |
| 2020/0143890 A1* | 5/2020 | Lee | G11C 16/3427 |
| 2021/0020254 A1 | 1/2021 | Kim et al. | |
| 2021/0020256 A1* | 1/2021 | Kim | G11C 16/26 |

* cited by examiner

METHOD OF PROGRAMMING NON-VOLATILE MEMORY DEVICE

CROSS-REFERENCE TO RELATED APPLICATIONS

This application claims priority under 35 U.S.C. § 119 to Korean Patent Application No. 10-2021-0154282 filed on Nov. 10, 2021 and Korean Patent Application No. 10-2022-0005911 file on Jan. 14, 2022, the collective subject matter of which is hereby incorporated by reference.

BACKGROUND

The inventive concept relates generally to memory devices, and more particularly, to methods of programming non-volatile memory devices including sequentially executed first and second programs.

Memory devices may generally be classified as volatile memory devices and non-volatile memory devices. In accordance with demand for high capacity and miniaturization of non-volatile memory devices, various three-dimensional (3D) memory devices including vertically-extending cell strings have been developed. During a channel initialization period associated with a programming operation, a channel initialization (or precharge) operation may be performed in relation to the cell strings. In this regard, when upper memory cells of the cell string are in a programmed state, a part of a channel corresponding to the programmed memory cells may be negatively boosted, and the channel initialization operation may not be properly performed due to high threshold voltage(s) of the programmed memory cells. And as a result, a program disturb or hot carrier injection (HCI) problem may arise, which may degrade the reliability of the non-volatile memory device.

SUMMARY

Embodiments of the inventive concept provide methods of programming a non-volatile memory device that reduce program disturb by controlling a word line voltage(s) during a channel initialization period.

According to an aspect of the inventive concept, a method of programming a non-volatile memory device may include; during a first channel initialization period, applying a first voltage to a selected word line and a first word line group proximate to the selected word line, and applying a second voltage lower than the first voltage to a second word line group distal from the selected word line, applying a first program voltage to the selected word line during a first program execution period in order to perform a first program operation for data, during a second channel initialization period, applying the first voltage to the selected word line and the first word line group, and applying the second voltage to the second word line group, and applying a second program voltage to the selected word line during a second program execution period in order to perform a second program operation for the data, wherein a program operation is performed on the first word line group and the second word line group before the first channel initialization period.

According to an aspect of the inventive concept, a method of programming a non-volatile memory device may include; during a first program execution period for data, performing a first program operation on first memory cells connected to a first selected word line by applying a first program voltage to the first selected word line, performing the first program operation on second memory cells connected to a second selected word line adjacent to the first selected word line, during a word line setup period following performing of the first program operation on the second memory cells, applying a first bias voltage to the first selected word line and applying a second bias voltage higher than the first bias voltage to the second selected word line, and during a second program execution period for the data, performing a second program operation on the first memory cells by applying a second program voltage to the first selected word line.

According to an aspect of the inventive concept, a method of programming a non-volatile memory device may include; applying a precharge voltage to a common source line during a channel initialization period, during a bit line setup period, applying a first voltage to a selected word line and a first word line disposed above the selected word line and applying a second voltage lower than the first voltage to a second word line disposed above the first word line, applying a third voltage lower than the first voltage and lower than the second voltage to the selected word line, the first word line and the second word line during a word line setup period, and performing a program operation on memory cells connected to the selected word line during a program execution period, wherein the channel initialization period and the bit line setup period are substantially a same time period, wherein a program operation is performed on the first word line and the second word line before the bit line setup period.

BRIEF DESCRIPTION OF THE DRAWINGS

Advantages, benefits, and features, as well as the making and use of the inventive concept may be more clearly understood upon consideration of the following detailed description together with the accompanying drawings, in which.

DETAILED DESCRIPTION

Throughout the written description and drawings, like reference numbers and labels are used to denote like or similar elements, components, features and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
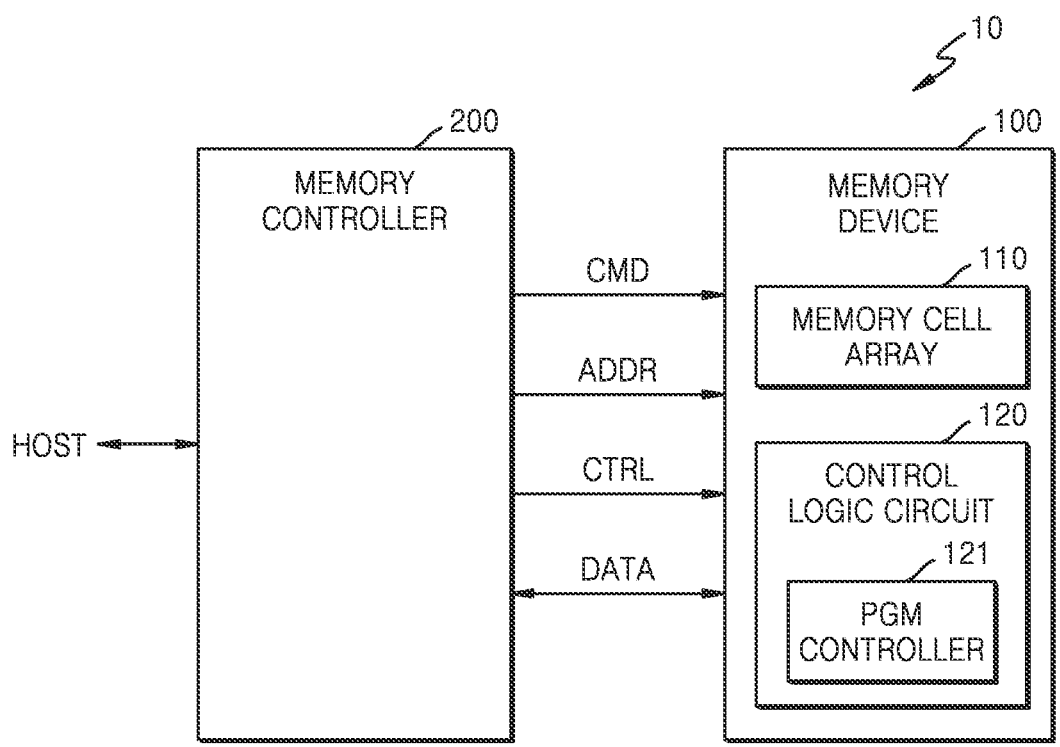
FIG. 1 is a block diagram illustrating a memory system according to embodiments of the inventive concept.

Figure (FIG.) 1 is a block diagram illustrating a memory system 10 according to embodiments of the inventive concept. Referring to FIG. 1, the memory system 10 may include a memory device 100 and a memory controller 200, wherein the memory device 100 includes a memory cell array 110 and a control logic circuit 120. The memory device 100 may be a non-volatile memory device. Accordingly, the term "memory device" may be used hereafter to refer to one or more non-volatile memory device(s).

The memory controller 200 may be configured to control the overall operation of the memory device 100 (e.g., the reading, writing (or programming) and/or erasing of data) in response to requests (e.g., a read request, a write request and/or an erase request) received from a host (HOST). In this regard, the memory controller 200 may variously control data access operations (e.g., write operations, read operations, and/or erase operations) performed by the memory device 100 by providing one or more address(es) ADDR, command(s) CMD, data (DATA) and/or control signal(s) CTRL (hereafter singularly or collectively, "control/address/data (or CAD) signal(s)") to the memory device 100. During at least some of the data access operations, "write data" may be programmed to, and/or "read data" may be retrieved from memory device 100. Further in this regard, one or more communication protocols may be used to transmit and/or receive (hereafter, "communicate") data (e.g., read data and/or write data) between the memory controller 200 and the memory device 100.

The memory cell array 110 may include a plurality of memory cells (e.g., flash memory cells). Hereinafter, certain embodiments of the inventive concept described hereafter assume the use of NAND flash memory cells, however, the inventive concept is not limited thereto. Alternately or additionally, the plurality of memory cells may include resistive memory cells, such as resistive random access memory (RAM) (ReRAM) memory cells, phase change RAM (PRAM) memory cells, and/or magnetic RAM (MRAM) memory cells.

Within the memory device 100, the control logic circuit 120 may receive CAD signals from the memory controller 200 and control the operation of the memory device 100 in response to same. Certain combination(s) of CAD signals may indicate (or correspond to) a program command issued from the memory controller 200. In some embodiments, the control logic circuit 120 may control a program operation including a first program operation and a second program operation with respect to a selected word line or a selected memory cell of the memory cell array 110, as indicated by the CAD signals. In this regard, the first and second program operations may be sequentially performed in such a manner that write data is programmed through the execution (or performance) of the first and second program operations. Further in this regard, the first program operation may be referred to as a "pre-program operation," or an "initial program operation," and the second program operation may be referred to as a "post-program operation" or a "final program operation."

In some embodiments, the control logic circuit 120 may include a program (PGM) controller 121. During a channel precharge (or "channel initialization") period associated with the first program operation, the PGM controller 121 may group word lines on which data programming is performed before the selected word line corresponding to the address ADDR into at least two word line groups. For example, the PGM controller 121 may apply a first voltage to a "proximate" word line group disposed relatively close to the selected word line among the at least two word line groups. The PGM controller 121 may also apply a second voltage (different from the first voltage) to a "distal" word line group disposed relatively far from the selected word line. In some embodiments, the first voltage to be higher than the second voltage. For example, the first voltage may be substantially similar to a voltage applied to the selected word line, thereby reducing a channel potential difference in a boundary word line and suppressing negative boosting in a channel region.

Figure 2:
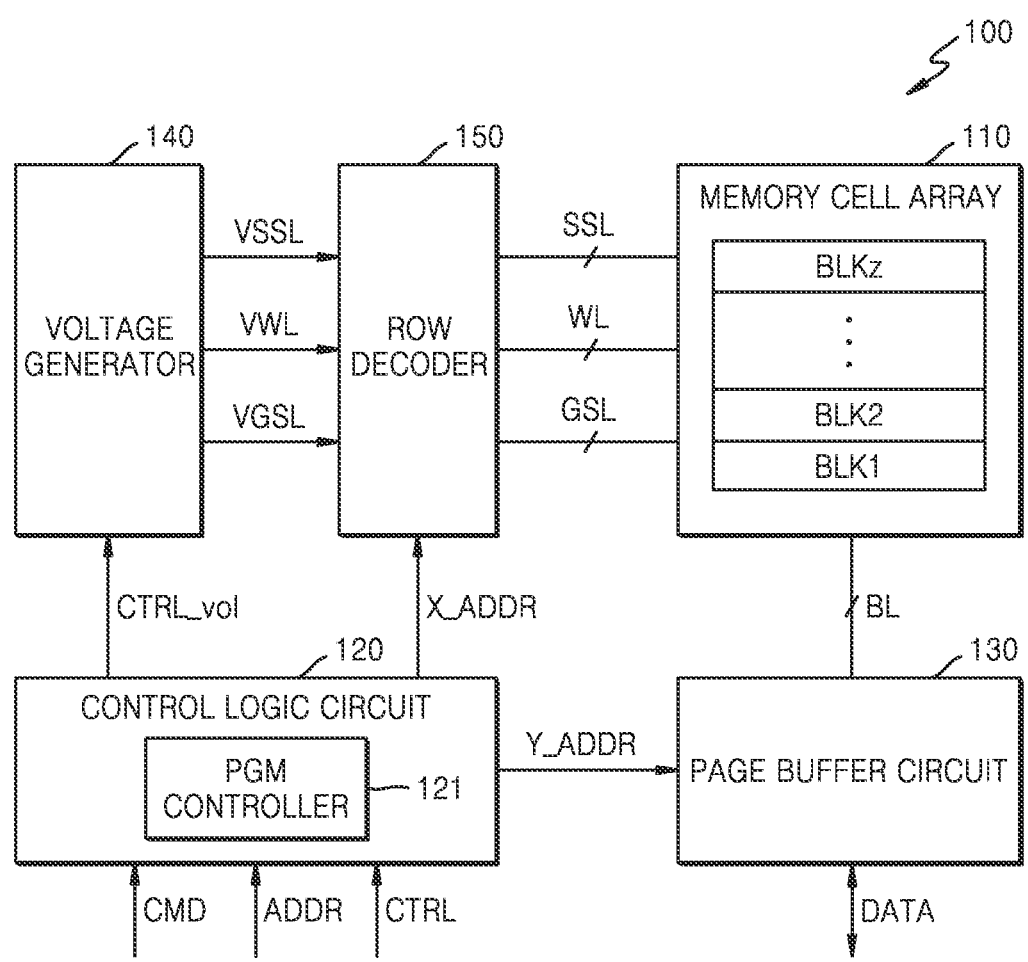
FIG. 2 is a block diagram further illustrating in one example the memory device 100 of FIG. 1.

FIG. 2 is a block diagram further illustrating in one example the memory device 100 of FIG. 1. Referring to FIG. 2, the memory device 100 may include the memory cell array 110, the control logic circuit 120, a page buffer circuit 130, a voltage generator 140, and a row decoder 150.

Although not shown in FIG. 2, the memory device 100 may further include at least one interface circuit, such as a data input/output (I/O) circuit, a command/address I/O circuit, etc. In some embodiments, the memory device 100 may further include a temperature sensor.

The memory cell array 110 may include a plurality of memory blocks BLK1 to BLKz, where 'z' is a positive integer. Each of the plurality of memory blocks BLK1 to BLKz may include a plurality of pages, and each of the plurality of pages may include a plurality of memory cells. For example, a memory block may be a unit of erasing, and a page may be a unit of writing and reading. Each memory cell may store one or more bits. That is, each memory cell may be configured to operate as a single level memory cell (SLC), a multi-level memory cell (MLC), a triple level memory cell (TLC), or a quadruple level memory cell (QLC).

The memory cell array 110 may be connected to a number of word lines WL, string select lines SSL, ground select lines GSL, and bit lines BL. The memory cell array 110 may be connected to the row decoder 150 through the word lines WL, the string select lines SSL, and the ground select lines GSL, and may be variously connected to the page buffer circuit 130 through the bit lines BL. In some embodiments, the memory cell array 110 may be further connected to gate induced drain leakage (GIDL) erase control lines.

In some embodiments, the memory cell array 110 may configured as a three-dimensional (3D) memory cell array including cell strings or NAND strings. Each cell string may include memory cells respectively connected to word lines and vertically stacked on a substrate. (See. e.g., U.S. Pat. Nos. 7,679,133; 8,553,466; 8,654,587; 8,559,235; and published U.S. Patent Application No. 2011/0233648, the collective subject matter of which is hereby incorporated by reference).

The control logic circuit 120 may provide various control signals used during the programming of data to the memory cell array 110, or the reading of data from the memory cell array 110 in response to CAD signals received from the memory controller 200. Using this approach, the control logic circuit 120 may control various data access operations performed by the memory device 100. For example, the control logic circuit 120 may respectively provide a voltage control signal CTRL_vol to a voltage generator 140, a row address X_ADDR to the row decoder 150, and a column address Y_ADDR to the page buffer circuit 130. However, this is just an illustrative example and the inventive concept is not limited thereto. Indeed, those skilled in the art will appreciate that the control logic circuit 120 may variously provide alternate and/or additional control signals to the voltage generator 140, the row decoder 150, and/or the page buffer circuit 130.

As noted above, the PGM controller 121 may group word lines on which a program operation is performed into a plurality of word line groups, and generate an appropriate voltage control signal CTRL_vol to respectively apply different voltages to the plurality of word line groups during a channel initialization period. That is, the PGM controller 121 may determine a word line relatively proximate (e.g., physically close) to the selected word line on which the program operation is performed to be a first word line group, determine a word line relatively distal (e.g., physically far) from the selected word line on which the program operation is performed to be a second word line group, and generate the voltage control signal CTRL_vol to apply a first voltage equal to the selected word line to the first word line group and apply a second voltage lower than the first voltage to the second word line group during the channel initialization period.

Thus, the voltage generator 140 may generate voltages used during various data access operations in response to the voltage control signal CTRL_vol. For example, the voltage generator 140 may generate a word line voltage VWL, a string select line voltage VSSL, and a ground select line voltage VGSL. Here, the word line voltage VWL, string select line voltage VSSL, and the ground select line voltage VGSL may be provided to the row decoder 150. In this regard, the voltage generator 140 may generate a program voltage, a pass voltage, a read voltage, a program verify voltage, an erase voltage, etc., as a word line voltage VWL. The voltage generator 140 may further generate a bit line voltage, a common source line voltage, etc.

In some embodiments, the voltage generator 140 may generate the first voltage applied to the selected word line and the first word line group, and the second voltage applied to the second word line group. Here, the first and second voltages may be applied during a first or a second channel initialization period associated with the first or second program operation on the selected word line, as indicated by the voltage control signal CTRL_vol. (See, e.g., unselected string initial precharge (USIP)1 of FIG. 15 and USIP2 of FIG. 16). In some embodiments, the voltage generator 140 may be used generate the first voltage applied to a word line on which the first program operation is performed, wherein the second program operation may not be completed during the second channel initialization period for the second program operation on the selected word line as indicated by the voltage control signal CTRL_vol.

The row decoder 150 may select one of the plurality of word lines WL and select one of the plurality of string select lines SSL in response to the row address X_ADDR. For example, during the program operation, the row decoder 150 may apply the program voltage (e.g., VPGM of FIG. 10) to the selected word line during a program execution period, and apply the program verify voltage to the selected word line during a program verify period. Also, during the program execution period, the row decoder 150 may apply a first voltage (e.g., V1 of FIG. 10) to the first word line group and apply a second voltage (e.g., V2 of FIG. 10) to the second word line group during the channel initialization period. The page buffer circuit 130 may select at least one bit line from among the plurality of bit lines BL in response to the column address Y_ADDR. The page buffer circuit 130 may operate as a write driver or a sense amplifier according to an operational mode of the memory device 100.

Figure 3:
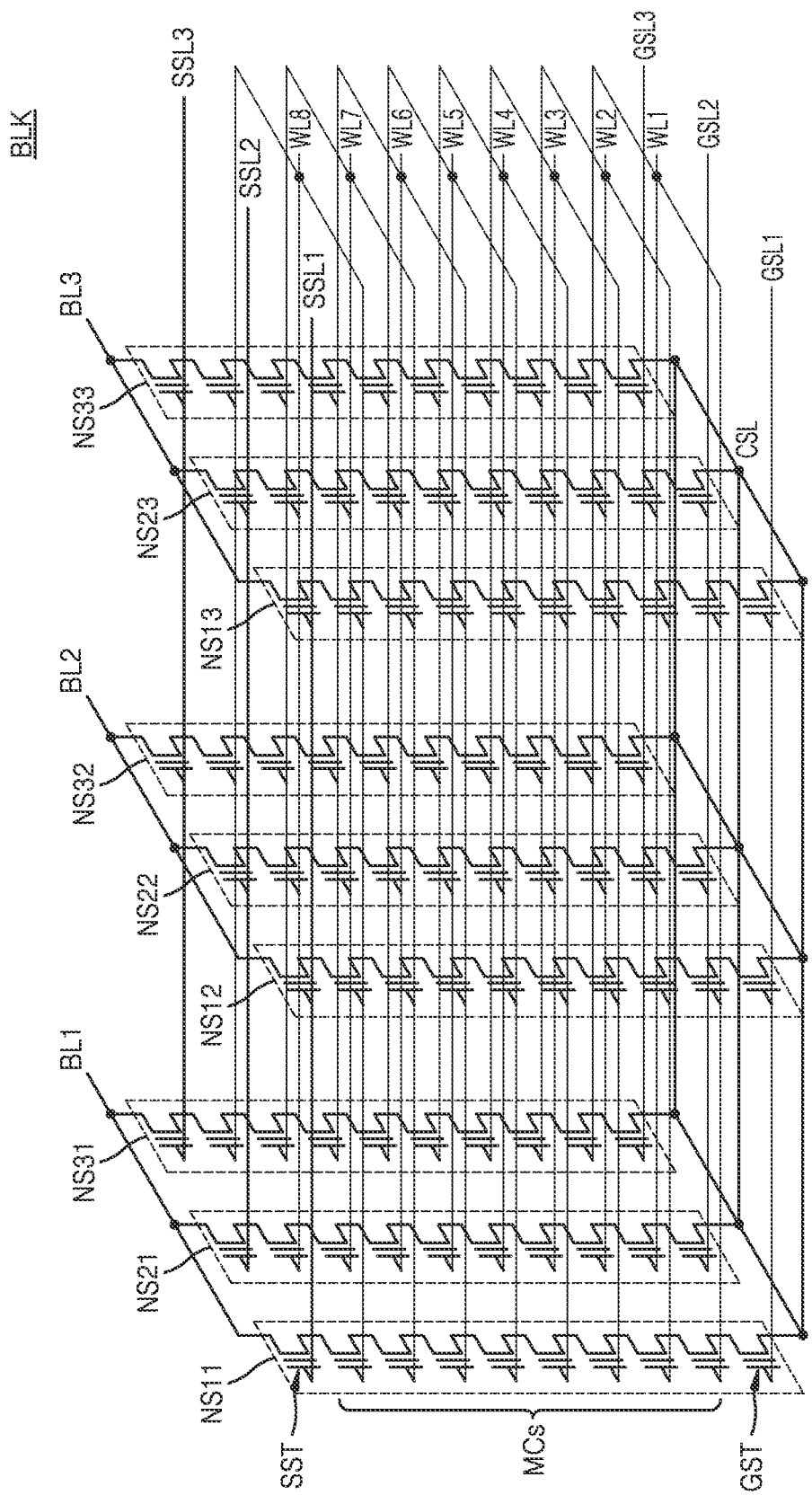
FIG. 3 is a partial circuit diagram illustrating a memory block according to an embodiment of the inventive concept.

FIG. 3 is a partial circuit diagram illustrating one possible implementation example for a memory block BLK according to embodiments of the inventive concept.

Referring to FIG. 3, the memory block BLK may correspond to one of the plurality of memory blocks BLK1 to BLKz described in relation to FIG. 2. The memory block BLK may be connected to bit lines BL1 to BL3, string select lines SSL1 to SSL3, word lines WL1 to WL8, and ground select lines GSL1 to GSL3, and may include NAND strings or cell strings NS11 to NS33, which extend in a vertical direction VD. Here, the number of cell strings, the number of word lines, the number of bit lines, the number of ground select lines, and the number of string select lines may be variously changed according to embodiments.

The bit lines BL1 to BL3 may extend in a first direction or a first horizontal direction HD1, and the word lines WL1 to WL8 may extend in a second direction or a second horizontal direction HD2. The cell strings NS11, NS21, and NS31 may be located between the first bit line BL1 and the common source line CSL, the cell strings NS12, NS22 and NS32 may be located between the second bit line BL2 and the common source line CSL, and the cell strings NS13, NS23, and NS33 may be located between the third bit line BL3 and the common source line CSL.

For example, the cell string NS11 may include a string select transistor SST, a plurality of memory cells MCs, and a ground select transistor GST connected in series. The string select transistor SST may be connected to the corresponding string select line SSL1, and the memory cells MCs may be respectively connected to the corresponding word lines WL1 to WL8. The ground select transistor GST may be connected to the corresponding ground select line GSL1.

In some embodiments, the memory block BLK may further include upper GIDL erase control lines between the bit lines BL1 to BL3 and the string select lines SSL1 to SSL3, and each cell string may further include at least one upper GIDL erase control transistor connected to the at least one upper GIDL erase control line. In some embodiments, the memory block BLK may further include lower GIDL erase control lines between the ground select lines GSL1 to GSL3 and the common source line CSL, and each cell string may further include at least one lower GIDL erase control transistor connected to the at least one lower GIDL erase control line.

Figure 4A:
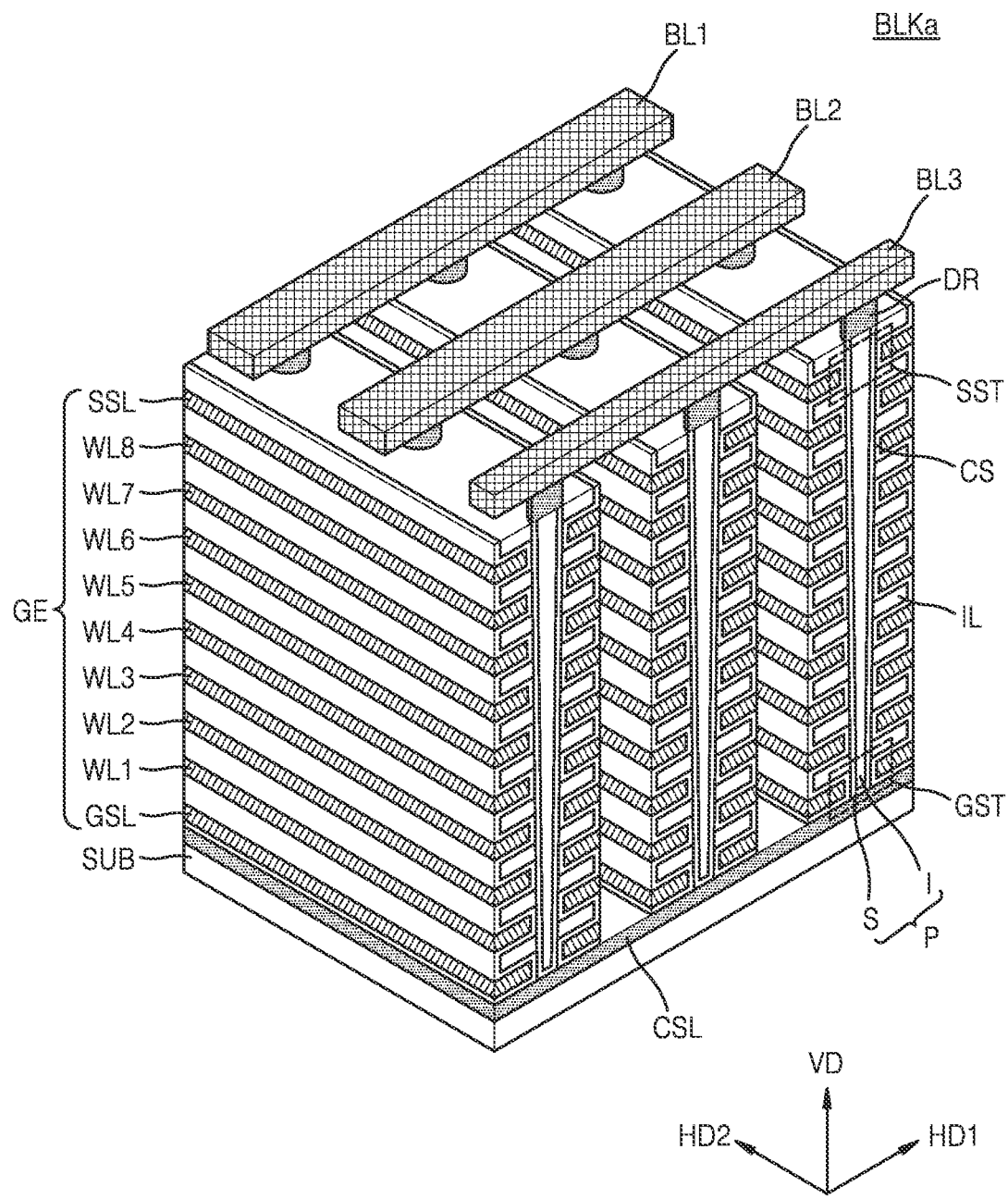
FIGS. 4A and 4B are respective perspective views illustrating memory blocks according to embodiments of the inventive concept.

FIG. 4A is a perspective view further illustrating in one example a memory block BLKa according to embodiments of the inventive concept. Referring to FIG. 4A, the memory block BLKa may correspond to one of the plurality of memory blocks BLK1 to BLKz described in relation to FIG. 2. Here, it is assumed that the memory block BLKa is configured in a vertical direction VD with respect to an arbitrarily identified horizontal substrate SUB arranged in relation to a first horizontal direction HD1 and a second horizontal direction HD2.

The substrate SUB has a first conductivity type (e.g., p-type) and extends on the substrate SUB in a second horizontal direction or the second direction HD2. In some embodiments, the common source line CLS doped with impurities of a second conductivity type (e.g., n-type) may be provided to the substrate SUB. In some embodiments, the substrate SUB may be implemented with polysilicon, and a plate-type common source line CSL may be disposed on the substrate SUB. A plurality of insulating layers IL extending in the second direction HD2 are sequentially provided on the substrate SUB in the vertical direction VD, and the plurality of insulating layers IL are apart from each other by a certain distance in the vertical direction VD. For example, the plurality of insulating layers IL may include an insulating material such as silicon oxide.

A plurality of pillars P sequentially disposed on the substrate SUB in a first horizontal direction or the first direction HD1 and penetrating the plurality of insulating layers IL in the vertical direction VD is provided. For example, the plurality of pillars P may pass through the plurality of insulating layers IL to make contact with the substrate SUB. Specifically, a surface layer S of each pillar P may include a silicon material of the first type and function as a channel region. Accordingly, in some embodiments, the pillar P may be referred to as a channel structure or a vertical channel structure. Meanwhile, an inner layer I of each pillar P may include an insulating material, such as silicon oxide or an air gap.

A charge storage layer CS is provided along exposed surfaces of the insulating layers IL, the pillars P, and the substrate SUB. The charge storage layer CS may include a gate insulating layer (also referred to as a 'tunneling insulating layer'), a charge trap layer, and a blocking insulating layer. For example, the charge storage layer CS may have an oxide-nitride-oxide (ONO) structure. In addition, gate electrodes GE, such as the ground select line GSL, the word lines WL1 to WL8, and the string select line SSL, are provided on the exposed surface of the charge storage layer CS. The numbers of ground select lines GSL, word lines WL1 to WL8, and the string select lines SSL may be changed according to an embodiment.

Drain contacts or drains DR are provided on the plurality of pillars P, respectively. For example, the drains DR may include a silicon material doped with impurities of the second conductivity type. The bit lines BL1 to BL3 extending in the first direction HD1 and spaced apart from each other by a specific distance in the second direction HD2 are provided on the drains DR.

Figure 4B:
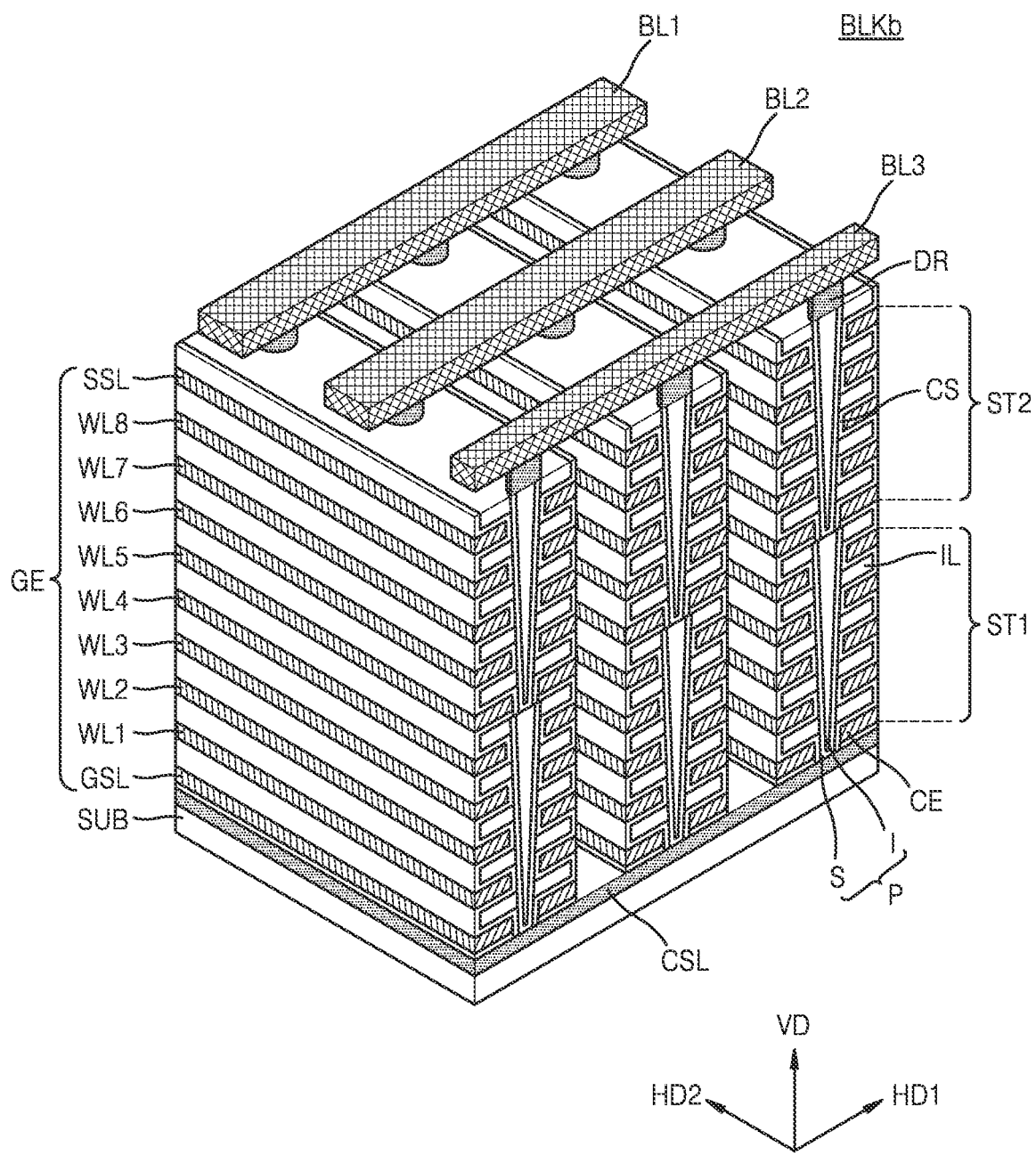

FIG. 4B is another perspective view illustrating another memory block BLKb according to embodiments of the inventive concept. Referring to FIG. 4B, the memory block BLKb may correspond to one of the plurality of memory blocks BLK1 to BLKz described in relation to FIG. 2. Here, the memory block BLKb may further correspond to a modified example of the memory block BLKa of FIG. 4A, wherein the memory block BLKb may include a first memory stack ST1 and a second memory stack ST2 vertically stacked on the first memory stack ST1. Alternately, the memory block BLKb may include three or more vertically stacked memory stacks.

Figure 5:
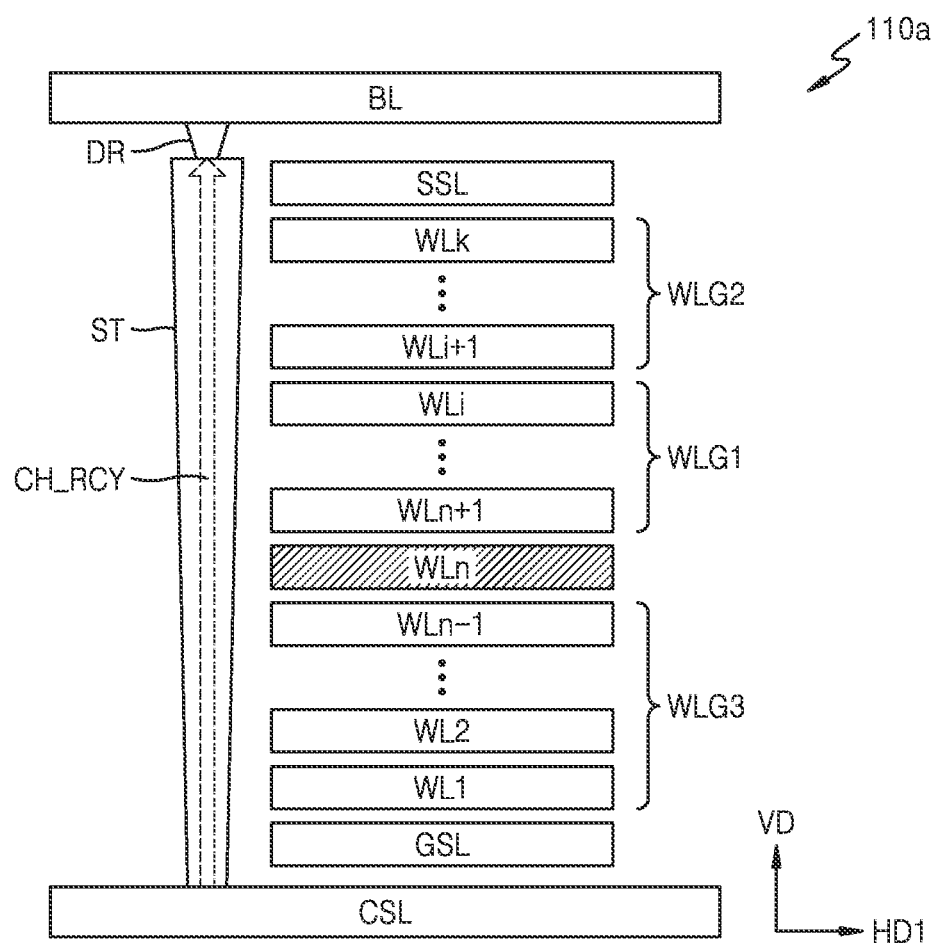
FIG. 5 is a cross-sectional view illustrating a memory cell array according to embodiments of the inventive concept.

FIG. 5 is a cross-sectional view illustrating a memory cell array 110a according to embodiments of the inventive concept—as one example of the memory array 110 of FIGS. 1 and 2. Referring to FIG. 5, the memory cell array 110a may include the common source line CSL and the bit line BL extending in the first direction HD1, and a memory stack ST extending in the vertical direction VD. In this case, the memory stack ST may be connected to the bit line BL through the drain DR. For example, the memory cell array 110a may correspond to the example of FIG. 4A, and the memory stack ST may correspond to the pillar P of FIG. 4A and the first cell string NS11 of FIG. 3. In some embodiments, a channel recovery CH_RCY or channel initialization may be performed in a direction from the common source line CSL to the bit line BL, but the inventive concept is not limited thereto. In some embodiments, the channel recovery CH_RCY or channel initialization may be performed in a direction from the bit line BL to the common source line CSL, and in other embodiments, the channel recovery CH_RCY may be performed in both directions.

The memory cell array 110a may further include a plurality of word lines WL1 to WLk stacked in the vertical direction VD, the ground select line GSL may be disposed between the common source line CSL and the word line WL1, and the string select line SSL may be disposed between the bit line BL and the word line WLk, where k is a positive integer. Although not shown, the upper GIDL erase control line may be further disposed between the string select line SSL and the bit line BL, or the lower GIDL erase control line may be further disposed between the ground select line GSL and the common source line CLS.

In some embodiments, during a program operation on the selected word line WLn, unselected word lines may be grouped into a plurality of word line groups including (e.g.) first, second and third word line groups WLG1, WLG2, and WLG3, where 'n' is a positive integer. In this regard, unselected word lines on which a program operation is performed before the selected word line WLn may be grouped into a plurality of word line groups including at least the first and second word line groups WLG1 and WLG2, and unselected word lines on which the program operation is performed later than the selected word line WLn may be grouped into at least one word line group including the third word line group WLG3. As described above in relation to certain embodiments of the inventive concept, word lines of a program sequence faster than the selected word line WLn may be grouped into at least two word line groups, and word lines of a program sequence slower than the selected word line WLn may be grouped into at least one word line group.

For example, a program operation may be performed in a direction from the word line WLk proximate (e.g., relatively close) to the bit line BL towards the word line WL1 proximate to the common source line CSL. That is, the program operation may be performed according to a top to bottom (T2B) programming sequence. In this regard, the word lines WLn+1 to WLk disposed above the selected word line WLn may be grouped into a plurality of word line groups including the first and second word line groups WLG1 and WLG2. For example, the first word line group WLG1 may include word lines (e.g., WLn+1 to WLi) proximate to the selected word line WLn, and the second word line group WLG2 may include word lines (e.g., WLi+1 to WLk) distal to the second word line group WLG2, where 'i' is a positive integer greater than 'n' and less than 'k'.

The word lines WL1 to WLn−1 disposed below the selected word line WLn may be grouped into at least one word line group including a third word line group WLG3. For example, the third word line group WLG3 may include the word lines WL1 to WLn−1. However, the inventive concept is not limited thereto, and in some embodiments, the word lines WL1 to WLn−1 disposed below the selected word line WLn may be grouped into a plurality of word line groups including the third word line group WLG3. For example, the third word line group WLG3 may include at least one word line (e.g., WLn−1) proximate (or relatively close) to the selected word line WLn, and the remaining word lines may be included in a fourth word line group.

Figure 6:
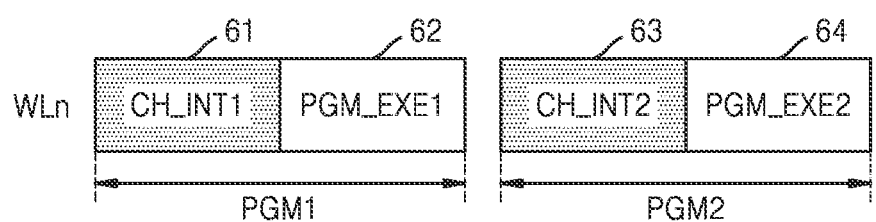
FIG. 6 is conceptual diagram illustrating a program operation including a first program operation and a second program operation on a selected word line according to embodiments of the inventive concept.

FIG. 6 is a conceptual diagram illustrating a program operation including a first program operation PGM1 and a second program operation PGM2 on the selected word line WLn according to embodiments of the inventive concept.

Referring to FIGS. 1 and 6, the memory device 100 may receive CAD signals (e.g., a write (or program) command CMD, write (or program) address(es) ADDR, and write (or program) data (DATA)) from the memory controller 200. The selected word line WLn may correspond to the address ADDR, and the memory device 100 may sequentially perform the first program operation PGM1 and the second program operation PGM2 to program the write data to a selected memory cell. The first program operation PGM1 may include a first channel initialization period CH_INT1 61 and a first program execution period PGM_EXE1 62, and the second program operation PGM2 may include a second channel initialization period CH_INT2 63 and a second program execution period PGM_EXE2 64. Here, a defined time interval may separate execution of the first program operation PGM1 and execution of the second program operation PGM2.

Figure 7:
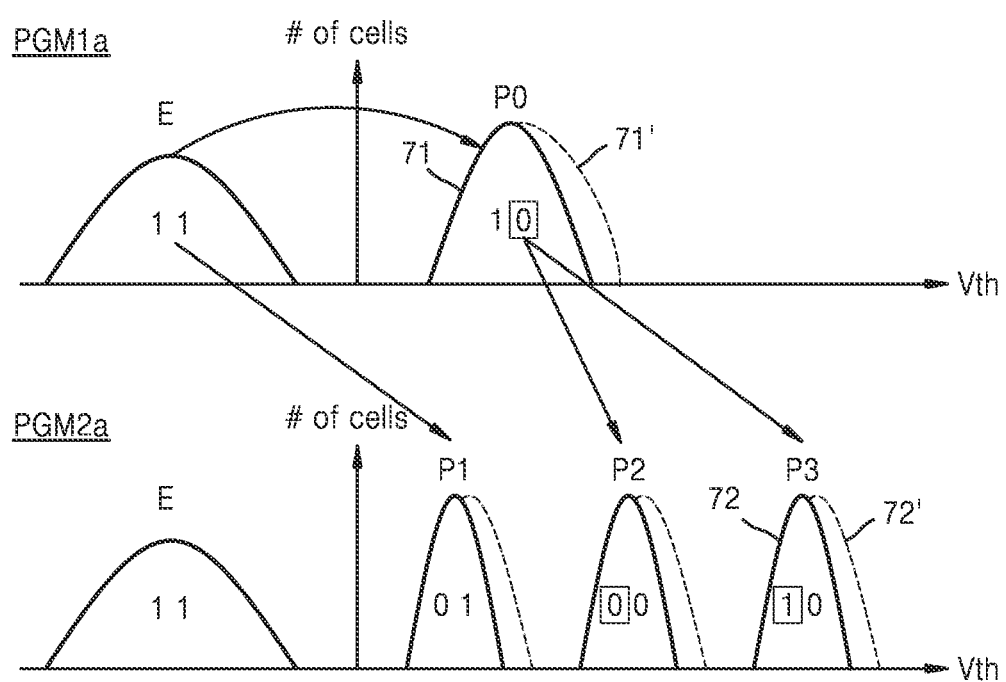
FIGS. 7 and 8 are respective, conceptual diagrams illustrating first and second program operations according to embodiments of the inventive concept.

FIG. 7 is a conceptual diagram further illustrating exemplary first and second program operations PGM1a and PGM2a according to embodiments of the inventive concept. A method of programming (e.g., a shadow program method) that includes the first and second program operations PGM1a and PGM2a will be described hereafter in relation to FIG. 7. The first and second program operations PGM1a and PGM2a may respectively correspond to the first and second program operations PGM1 and PGM2 of FIG. 6. Although the execution of the first and second program operations PGM1a and PGM2a is illustrated under an assumption that a MLC is used, those skilled in the art will appreciate that the method of programming described in relation to FIG. 7 may be extended to the programming TLC and QLC.

Referring to FIG. 7, the first program operation PGM1a may program memory cells originally in an erase state to one of M program states, where 'M' is an integer greater than 1. An initial program distribution 71 may be changed to a program distribution 71' by coupling or interference according to programming of peripheral memory cells. The second program operation PGM2a may program memory cells in which the first program operation PGM1a has been performed to one of N program states, where 'N' is an integer greater than M. An initial program distribution 72 may be changed to a program distribution 72' by coupling or interference according to the program operation of peripheral memory cells.

Figure 8:
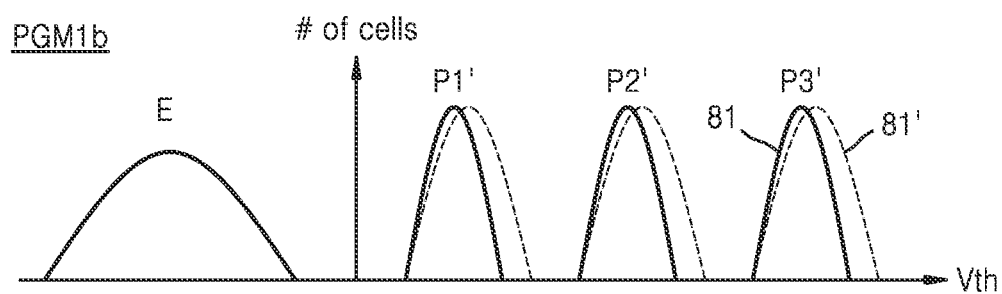
Figure 8:
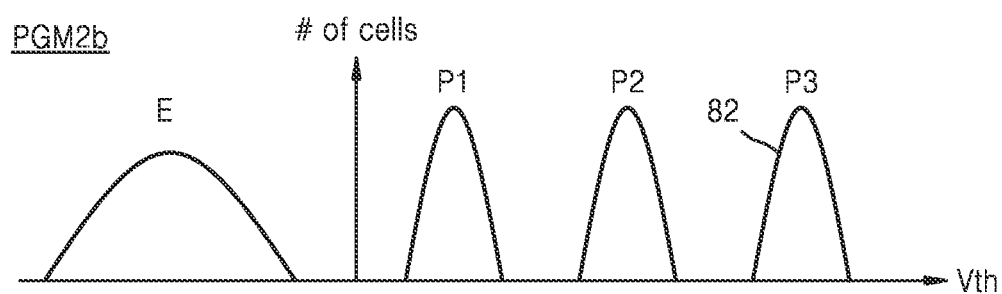

FIG. 8 is a conceptual diagram illustrating first and second program operations PGM1b and PGM2b according to embodiments of the inventive concept. In this regard, a method of programming including the first and second program operations PGM1b and PGM2b may be referred to as a "reprogram method." The first and second program operations PGM1b and PGM2b may respectively correspond to the first and second program operations PGM1 and PGM2 of FIG. 6. Here again, the first and second program operations PGM1b and PGM2b are illustrated in relation to an MLC, but may alternately be performed in relation to TLC or QLC.

The first program operation PGM1b may program memory cells in an erase state to one of N program states. An initial program distribution 81 may be changed to a program distribution 81' by coupling or interference according to a program operation of peripheral memory cells. The second program operation PGM2b may program memory cells on which the first program operation PGM1b is performed into one of N program states. An initial program distribution 82 may be changed to a program distribution 82' by coupling or interference according to the program operation of peripheral memory cells.

Figure 9:
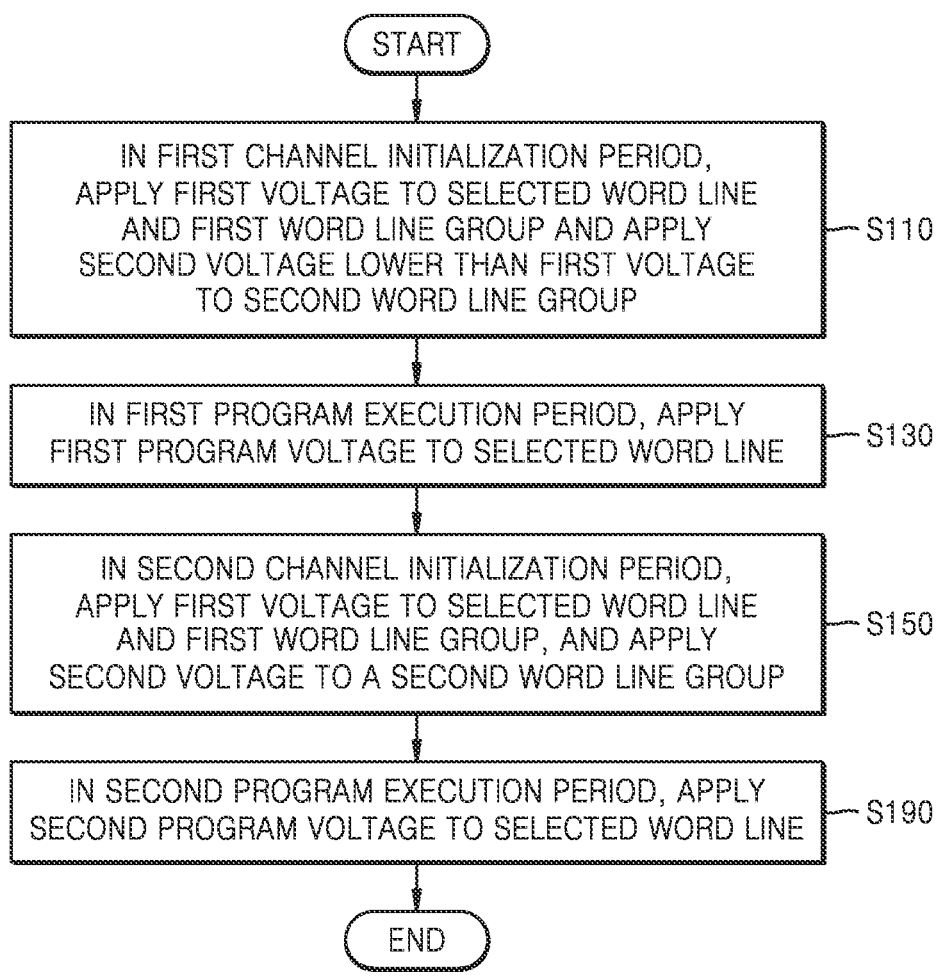
FIG. 9 is a flowchart illustrating a method of programming a memory device according to embodiments of the inventive concept.

FIG. 9 is a flowchart illustrating a method of programming a memory device according to embodiments of the inventive concept. In certain aspects, the method of FIG. 9 may be understood as a method of controlling voltages applied to unselected word lines in (or during) a channel initialization period of a program operation. The method of FIG. 9 may be executed using the memory device 100 of FIG. 1.

Referring to FIGS. 6 and 9, in (or during) the first channel initialization period 61, a first voltage (e.g., V1 of FIG. 10) may be applied to the selected word line WLn and the first word line group WLG1 and a second voltage (e.g., V2 of FIG. 10) lower than the first voltage may be applied to the second word line group WLG2 (S110). Here, a program sequence of the memory device may correspond to directions of the second word line group WLG2, the first word line group WLG1, and the selected word line WLn. During the first program execution period 62, a first program voltage (e.g., VPGM of FIG. 10) may be applied to the selected word line WLn (S130).

During the second channel initialization period 63, the first voltage (e.g., V1 of FIG. 10) may be applied to the selected word line WLn and the first word line group WLG1, and the second voltage (e.g., V2 of FIG. 10) may be applied to the second word line group WLG2 (S150). Thus, a voltage applied to the first word line group WLG1 may be the same as the first voltage, and a voltage applied to the second word line group WLG2 may be the same as the second voltage, but the inventive concept is not limited thereto.

Then, during the second program execution period 64, a second program voltage (e.g., VPGM of FIG. 10) may be applied to the selected word line WLn (S190).

Figure 10:
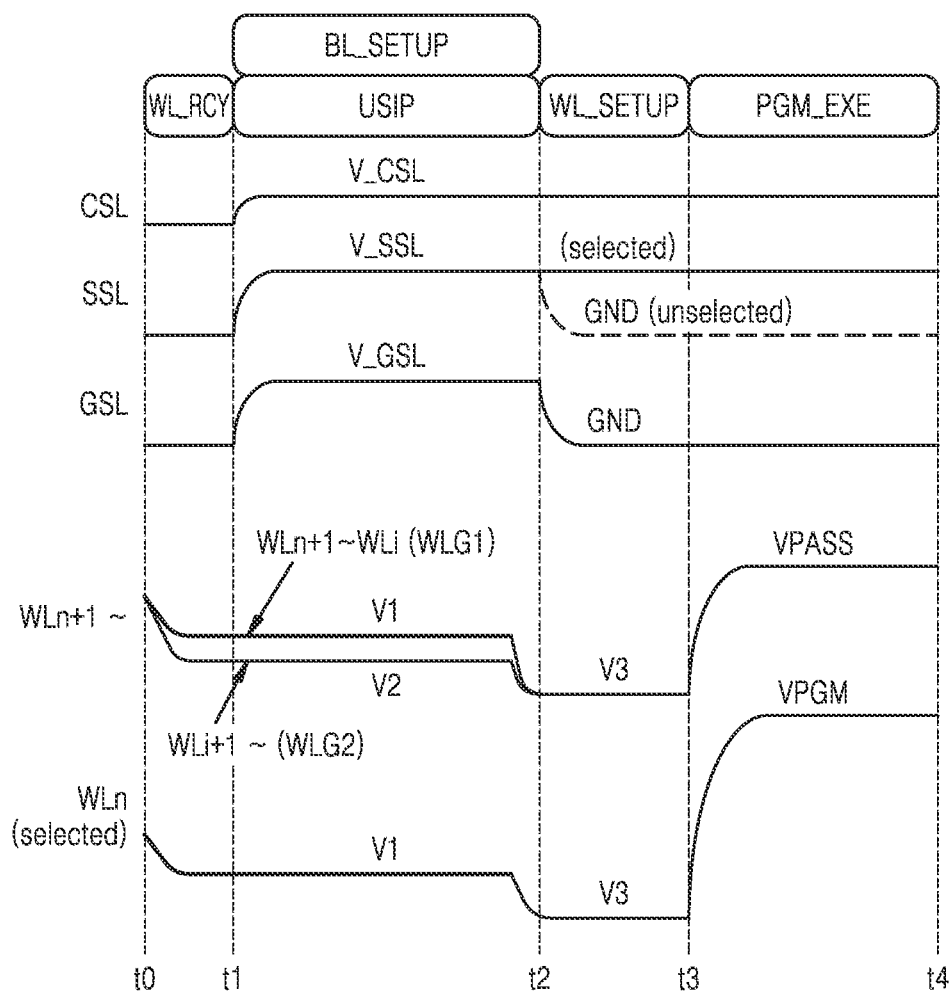
FIG. 10 is a timing diagram illustrating a program operation of a memory device according to embodiments of the inventive concept.

FIG. 10 is a timing diagram further illustrating a program operation that may be performed by a memory device according to embodiments of the inventive concept.

Referring to FIG. 10, a word line recovery period WL_RCY may correspond to a time period between t0 and t1, and during the word line recovery period WL_RCY, a word line voltage may drop to a certain voltage level. Subsequently, a channel initialization period or unselected string initial precharge period USIP corresponding to a time period between t1 and t2, for example, may correspond to the first channel initialization period 61 or the second channel initialization period 63 of FIG. 6. Also, the channel initialization period USIP may be substantially similar to that of a bit line setup period BL_SETUP, and during the channel initialization period USIP, channel initialization and bit line setup operations may be performed in parallel (e.g., temporally overlapping at least in part).

During the channel initialization period USIP, a common source line voltage VCSL may be applied to the common source line CSL, a string select line voltage VSSL may be applied to the string select line SSL, and a ground select line voltage VGSL may be applied to the ground select line GSL. The string select line voltage VSSL may correspond to a voltage level that turns ON the string select transistor (e.g., SST of FIG. 3), and the ground select line voltage VGSL may correspond to a voltage level that turns ON the ground select transistor (e.g., GST of FIG. 3).

During the channel initialization period USIP, the first voltage V1 may be applied to the selected word line WLn and the word lines WLn+1 to WLi adjacent to the selected word line WLn, and the second voltage V2 may be applied to word lines WLi+1~. The word lines WLn+1 to WLi may be included in the first word line group WLG1, and the word lines WLi+1~ may be included in the second word line group WLG2. A threshold voltage of memory cells connected to the word lines WLn+1 to WLi on which the program operation is performed may be relatively high. In some embodiments, during the channel initialization period USIP, the same first voltage may be applied to the selected word line WLn and the adjacent the word lines WLn+1 to WLi. Accordingly, a channel potential difference between the selected word line WLn and the adjacent word lines WLn+1 to WLi may be reduced. Thus, negative boosting may be suppressed in a channel region corresponding to the adjacent word lines WLn+1 to WLi.

The word line setup period WL_SETUP may correspond to a time period between t2 and t3. During the word line setup period WL_SETUP, the string select line voltage VSSL may be continuously applied to the selected string select line, while ground voltage GND is applied to the unselected string select line. Also, during the word line setup period WL_SETUP, the common source line voltage VCSL may be continuously applied to the common source line CSL, ground voltage GND may be applied to the ground select line GSL, and the third voltage V3 may be applied to the selected word line WLn and the unselected word lines WLn+1~. In this regard, the third voltage V3 may have a lower voltage level than those of the first and second voltages V1 and V2. For example, the third voltage V3 may correspond to ground voltage GND, but the inventive concept is not limited thereto.

The program execution period PGM_EXE may correspond to, for example, the first program execution period 62 or the second program execution period 64 of FIG. 6, and may correspond to a time period between t3 and t4. During the program execution period PGM_EXE, a program voltage VPGM may be applied to the selected word line WLn, and a pass voltage VPASS may be applied to the unselected word lines WLn+1~. In this regard, the program voltage VPGM may have a higher voltage level than that of the pass voltage VPASS.

Figure 11:
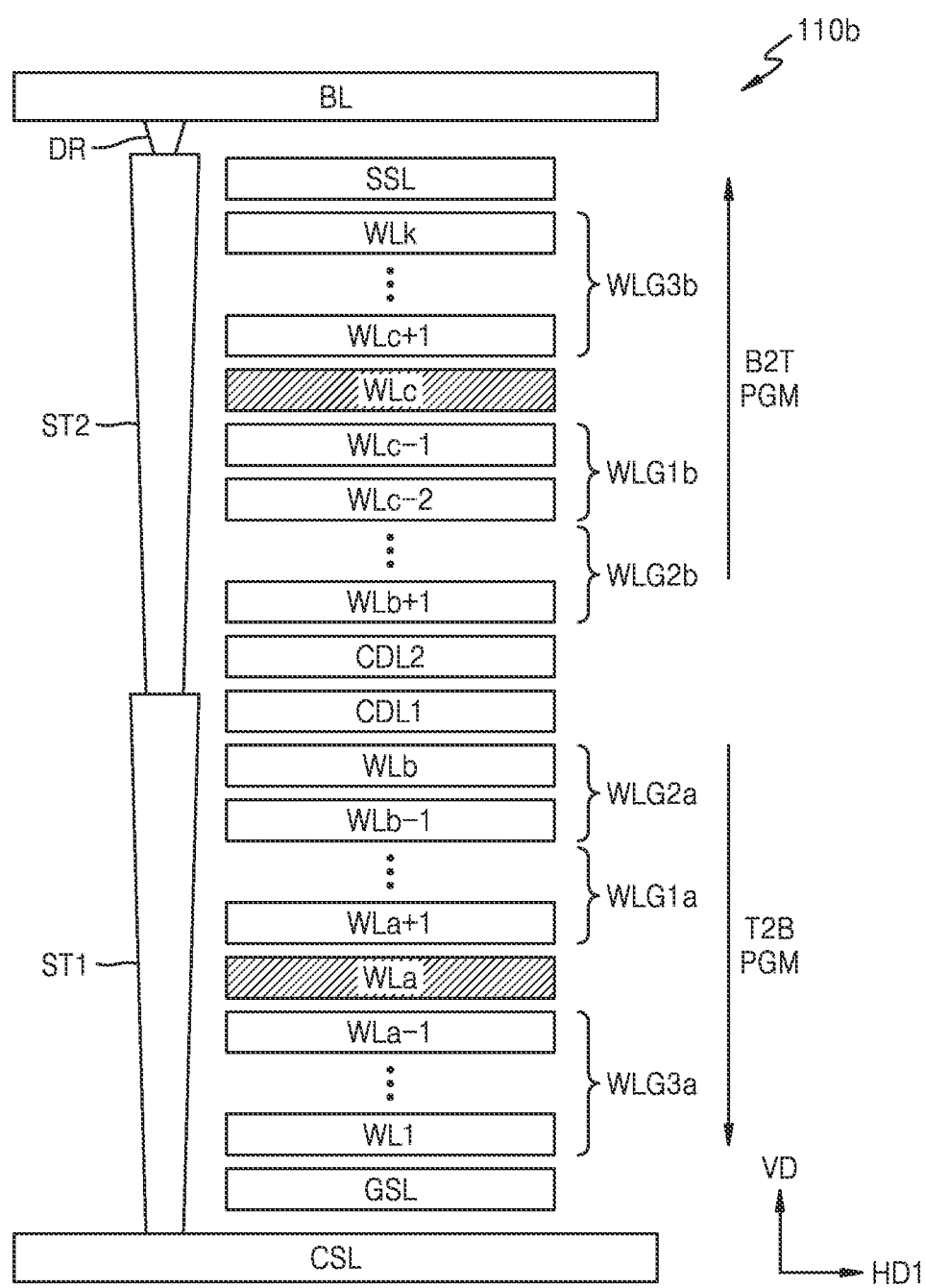
FIG. 11 is a cross-sectional diagram illustrating a memory cell array according to embodiments of the inventive concept.

FIG. 11 a cross-sectional view illustrating a memory cell array 110b according to embodiments of the inventive concept. Referring to FIG. 11, the memory cell array 110b may include the common source line CSL and the bit line BL extending in the first direction HD1, and may include a first memory stack ST1 and a second memory stack ST2 extending in the vertical direction VD. In this case, the first memory stack ST1 may be disposed on the common source line CSL, and the second memory stack ST2 may be vertically disposed on the first memory stack ST1 and may be connected to the bit line BL through the drain DR. For example, the memory cell array 110b may correspond to the embodiment illustrated in FIG. 4B, and the first memory stack ST1 and the second memory stack ST2 may respectively correspond to the first memory stack ST1 and the second memory ST2 of FIG. 4B.

The memory cell array 110b may include the plurality of word lines WL1 to WLk vertically stacked in the vertical direction VD, the ground select line GSL may be disposed between the common source line CSL and the word line WL1, and the string select line SSL may be disposed between the bit line BL and the word line WLk. Also, the memory cell array 110b may further include first and second center dummy word lines CDL1 and CDL2 corresponding to a junction of the first memory stack ST1 and the second memory stack ST2. However, the inventive concept is not limited thereto, and the number of junction dummy word lines corresponding to the junction may vary by design, or may be omitted entirely.

For example, in the case of the first memory stack ST1, a program (i.e., T2B PGM) may be performed in a direction from a word line distal (or relatively far) from the common source line CSL to a word line proximate (or relatively close) to the common source line CSL. In this regard, word lines WLa+1 to WLb disposed above the selected word line WLa may be grouped into a plurality of word line groups including first and second word line groups WLG1a and WLG2a. For example, the first word line group WLG1a may include the word line WLa+1 relatively close to the selected word line WLa, the second word line group WLG2a may include word lines (e.g., WLb−1 and WLb) relatively far from the selected word line group WLa, where 'a' and 'b' are positive integers greater than 1, and 'b' is greater than 'a'. Here, the word lines WL1 to WLa−1 disposed below the selected word line WLa may be grouped into at least one word line group including a third word line group WLG3a.

For example, in the case of the second memory stack ST2, a program (i.e., bottom to top (B2T) PGM) may be performed in a direction from a distal word line relative to the bit line BL to a proximate word line relative to the bit line BL. In this regard, the word lines WLb+1 to WLc below the selected word line WLc may be grouped into a plurality of word line groups including first and second word line groups WLG1*b* and WLG2*b*. For example, the first word line group WLG1*b* may include word lines WLc−1 and WLc−2 relatively close to the selected word line WLc, and the second word line group WLG2*b* may include word lines WLb+1 relatively far from the selected word line group WLc, where 'c' is a positive integer greater than 'b'. Here, the word lines WLc+1 to WLk disposed above the selected word line WLc may be grouped into at least one word line group including a third word line group WLG3*b*.

In some embodiments, during a program operation performed on the selected word line WLa, different voltages may be applied to the first and second word line groups WLG1*a* and WLG2*a* and the same voltage may be applied to the word lines WLb+1 to WLk connected to the second memory stack ST2 during a first channel initialization period associated with a first program operation. In some embodiments, during a program operation on the selected word line WLc, different voltages may be applied to the first and second word line groups WLG1*b* and WLG2*b* and the same voltage may be applied to the word lines WL1 to WLb connected to the first memory stack ST1 during the first channel initialization period associated with the first program operation.

In some embodiments, during a program operation performed on the selected word line WLa, at least one of voltages applied to the first to third word line groups WLG1*a*, WLG2*a*, and WLG3*a* may be controlled differently and the same voltage may be applied to the word lines WLb+1 to WLk connected to the second memory stack ST2 during a second channel initialization period associated with a second program operation. In some embodiments, during a program operation on the selected word line WLc, at least one of voltages applied to the first to third word line groups WLG1*a*, WLG2*a*, and WLG3*a* may be controlled differently and the same voltage may be applied to the word lines WL1 to WLb connected to the first memory stack ST1 during the second channel initialization period associated with the second program operation.

However, the inventive concept is not limited to only the foregoing approaches, and in some embodiments, in the case of the first memory stack ST1, a program (i.e., B2T PGM) may be performed in a direction from a word line proximate to the common source line CSL to a word line distal from the common source line CSL, and in the case of the second memory stack ST2, a program (i.e., T2B PGM) may be performed in a direction from a word line proximate to the bit line BL to a word line distal from the bit line BL.

Here, in some embodiments, in the case of the first memory stack ST1, a program (i.e., B2T PGM) may be performed in a direction from a word line proximate to the common source line CSL to a word line distal from the common source line CSL, and in the case of the second memory stack ST2, a program (i.e., B2T PGM) may be performed in a direction from a word line distal from the bit line BL to a word line proximate to the bit line BL. Furthermore, in some embodiments, in the case of the first memory stack ST1, a program (i.e., T2B PGM) may be performed in a direction from a word line distal from the common source line CSL to a word line proximate to the common source line CSL, and, in the case of the second memory stack ST2, a program (i.e., T2B PGM) may be performed in a direction from a word line proximate to the bit line BL to a word line distal from the bit line BL. As noted above, word line groups in each memory stack may be variously grouped according to different program directions for each memory stack.

Figure 12A:
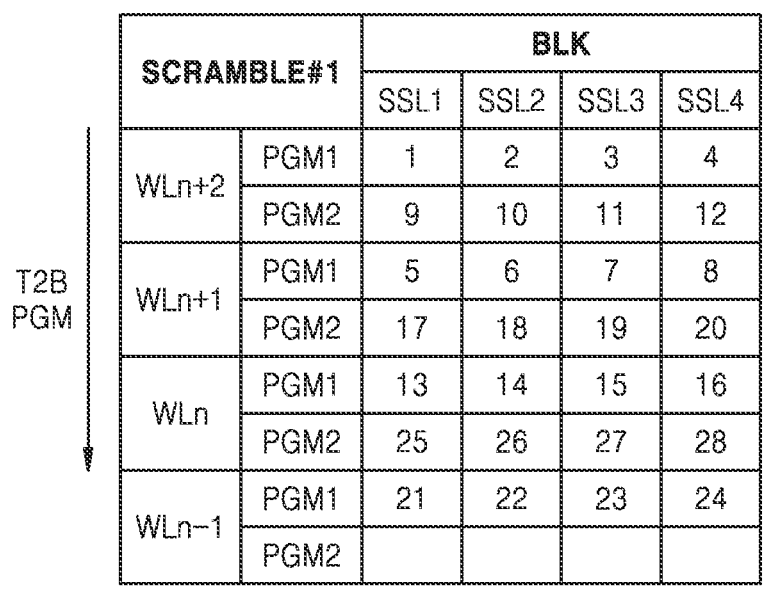
FIGS. 12A and 12B are respective tables listing program sequences according to embodiments of the inventive concept.

FIG. 12A is a table listing an exemplary program sequence according to embodiments of the inventive concept. Referring to FIG. 12A, certain embodiments of the inventive concept may correspond to a first scrambling method (e.g., a T2B method of programming) in which programming is performed from memory cells proximate (e.g., adjacent) to a bit line to memory cells proximate (or adjacent) to a common source line. For example, the memory block BLK may include word lines WLn−1, WLn, WLn+1, and WLn+2 and first to fourth string select lines SSL1 to SSL4.

Here, the first program operations PMG1 may be sequentially performed on memory cells connected to the word line WLn+2 and the first string select line SSL1, memory cells connected to the word line WLn+2 and the second string select line SSL2, memory cells connected to the word line WLn+2 and the third string select line SSL3, and memory cells connected to the word line WLn+2 and the fourth string select line SSL4. Subsequently, the first program operations PMG1 may be sequentially performed on the memory cells connected to the word line WLn+1 and the first string select line SSL1, the memory cells connected to the word line WLn+1 and the second string select line SSL2, the memory cells connected to the word line WLn+1 and the third string select line SSL3, and the memory cells connected to the word line WLn+1 and the fourth string select line SSL4. Subsequently, second program operations PMG2 may be sequentially performed on the memory cells connected to the word line WLn+2 and the first string select line SSL1, the memory cells connected to the word line WLn+2 and the second string select line SSL2, the memory cells connected to and the word line WLn+2 and the third string select line SSL3, and the memory cells connected to the word line WLn+2 and the fourth string select line SSL4.

Thus, before performing the second program operation PGM2 on the memory cells connected to the word line WLn+2 and the first string select line SSL1, the first program operation PGM1 may be performed on the memory cells connected to the word line WLn+1 and on the fourth string select line SSL4, and thus, the memory cells connected to the word line WLn+2 and the first string select line SSL1 may experience a sufficiently long time while maintaining a voltage difference between the word line and the channel after the first program operation PGM1. Accordingly, a channel trap state of the cell string during a verify operation and a read operation may be similar, and thus, a distribution of a memory device may be improved. In addition, a time between the first program operation PGM1 and the second program operation PGM2 is increased, thereby reducing the influence of a shallow trap.

Figure 12B:
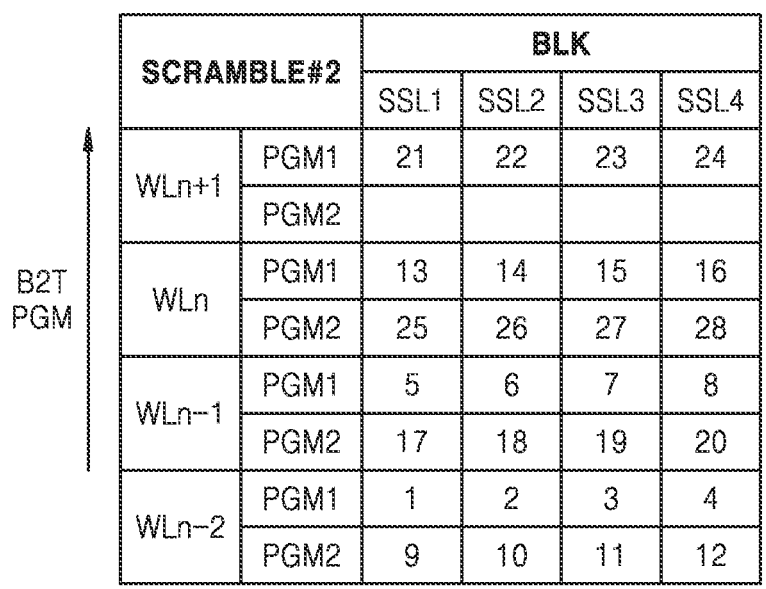

FIG. 12B is another table listing a program sequence according to embodiments of the inventive concept. Referring to FIG. 12B, a program method (e.g., a modified version B2T of the T2B program method of FIG. 12A) may be used to sequentially perform programming of memory cells proximate (or adjacent) to a common source line to memory cells proximate (or adjacent) to a bit line.

For example, the first program operations PMG1 may be sequentially performed on memory cells connected to the word line WLn−2 and the first string select line SSL1, memory cells connected to the word line WLn−2 and the second string select line SSL2, memory cells connected to the word line WLn−2 and the third string select line SSL3, and memory cells connected to the word line WLn−2 and the fourth string select line SSL4. Subsequently, the first program operations PMG1 may be sequentially performed on memory cells connected to the word line WLn−1 and the first string select line SSL1, memory cells connected to the word line WLn−1 and the second string select line SSL2, memory cells connected to the word line WLn−1 and the third string select line SSL3, and memory cells connected to the word line WLn−1 and the fourth string select line SSL4. Subsequently, second program operations PMG2 may be sequentially performed on the memory cells connected to the word line WLn−2 and the first string select line SSL1, the memory cells connected to the word line WLn−2 and the second string select line SSL2, the memory cells connected to the word line WLn−2 and the third string select line SSL3, and the memory cells connected to the word line WLn−2 and the fourth string select line SSL4.

Thus, before performing the second program operation PGM2 on the memory cells connected to the word line WLn−2 and the first string select line SSL1, the program operation PGM1 may be performed on the memory cells connected to the word line WLn−1 and the fourth string select line SSL4, and thus, the memory cells connected to the word line WLn−2 and the first string select line SSL1 may experience a sufficiently long time while maintaining a voltage difference between the word line and the channel after the first program operation PGM1. Accordingly, a channel trap state of the cell string during a verify operation and a read operation may be similar, thereby improving distribution of a memory device. In addition, a time between the first program operation PGM1 and the second program operation PGM2 may be increased, thereby reducing the influence of a shallow trap.

Figure 13:
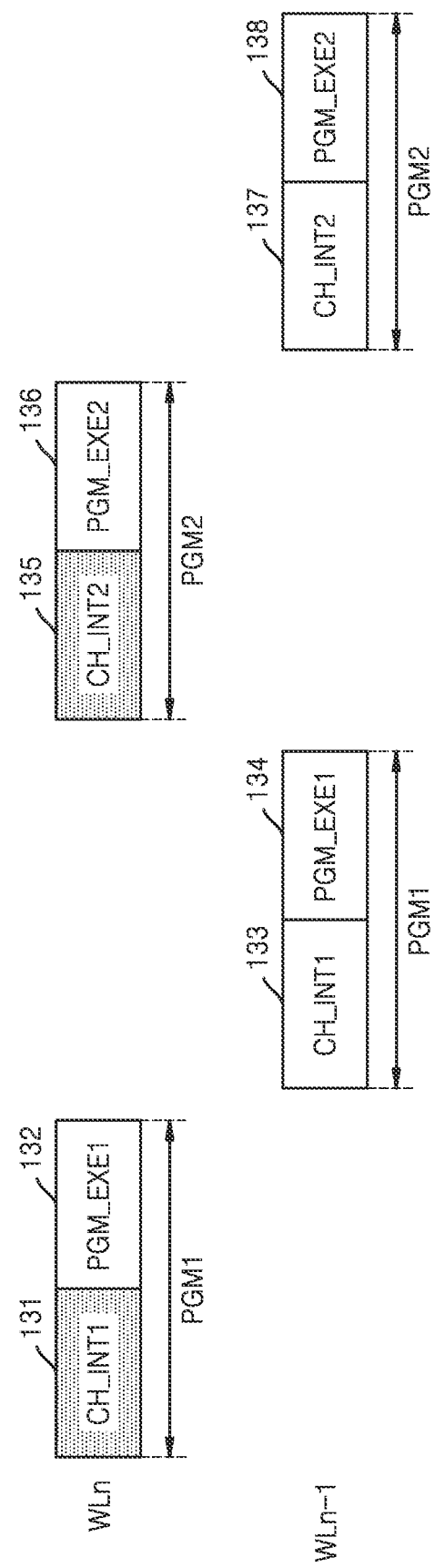
FIG. 13 is a conceptual diagram illustrating a program operation including first and second program operations on a selected word line and first and second program operations on an adjacent word line according to embodiments of the inventive concept.

FIG. 13 is a conceptual diagram illustrating a program operation including the first and second program operations PGM1 and PGM2 on the selected word line WLn and the first and second program operations PGM1 and PGM2 on the adjacent word line WLn−1 according to embodiments of the inventive concept.

Referring to FIG. 13, assuming a program sequence is a T2B program, program operations on the selected word line WLn and the adjacent word line WLn−1 below the selected word line WLn may be sequentially performed. That is, the first program operation PGM1 including a first channel initialization period 131 and a first program execution period 132 on the selected word line WLn, the first program operation PGM1 including a first channel initialization period 133 and a first program execution period 134 on the adjacent word line WLn−1, the second program operation PGM2 including a second channel initialization period 135 and a second program execution period 136 on the selected word line WLn, and the second program operation PGM2 including a second channel initialization period 137 and a second program execution period 138 on the adjacent word line WLn−1 may be sequentially performed. Thus, between the first and second program operations PGM1 and PGM2 on the selected word line WLn, the first program operation PGM1 on the adjacent word line WLn−1 may be performed.

However, the inventive concept is not limited thereto, and assuming the program sequence is a B2T program, program operations on the selected word line WLn and the adjacent word line WLn+1 above the selected word line WLn may be sequentially performed. That is, the first program operation PGM1 on the selected word line WLn, the first program operation PGM1 on the adjacent word line WLn+1, the second program operation PGM2 on the selected word line WLn, and the second program operation PGM2 on the adjacent word line WLn+1 may be sequentially performed. Thus, between the first and second program operations PGM1 and PGM2 on the selected word line WLn, the first program operation on the adjacent word line WLn+1 may be performed.

Figure 14:
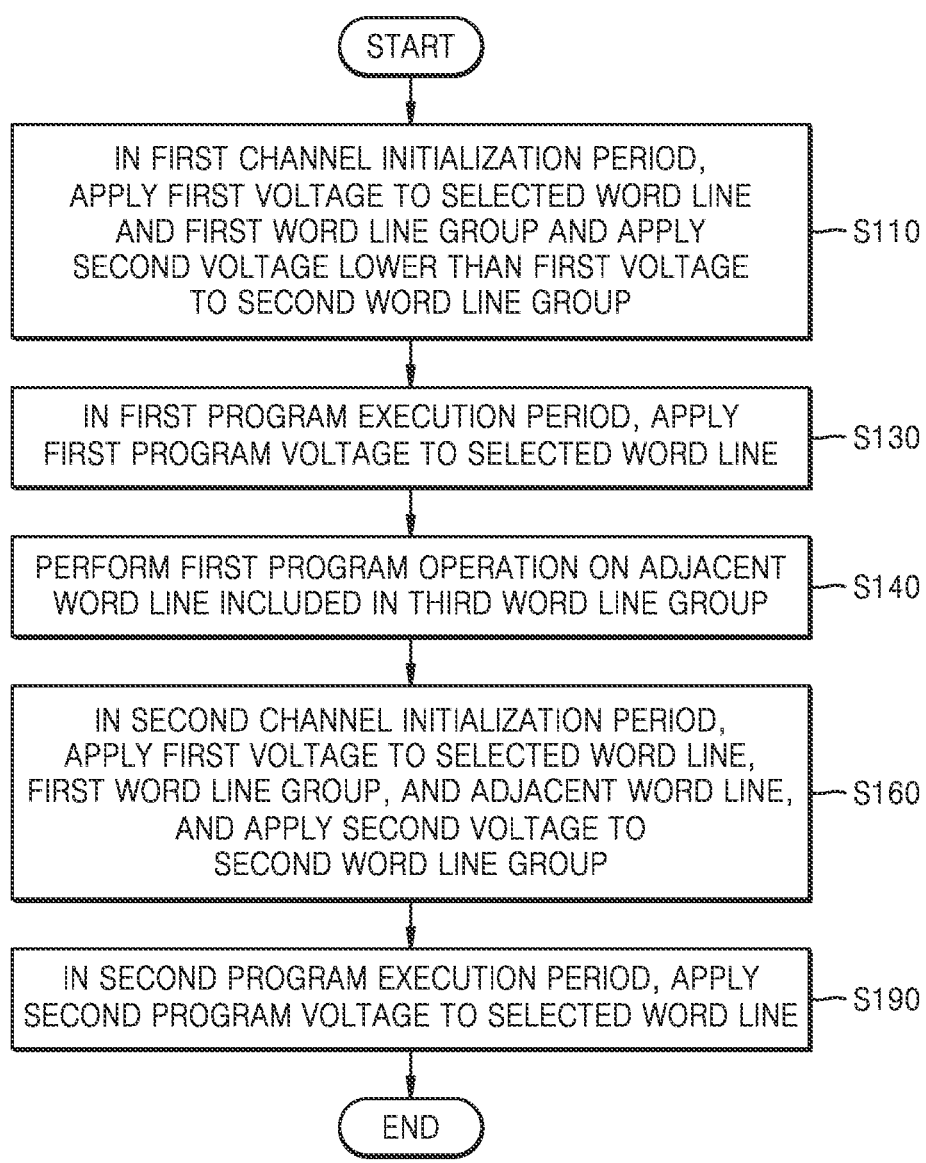
FIG. 14 is a flowchart illustrating a method of programming a memory device according to embodiments of the inventive concept.
Figure 15:
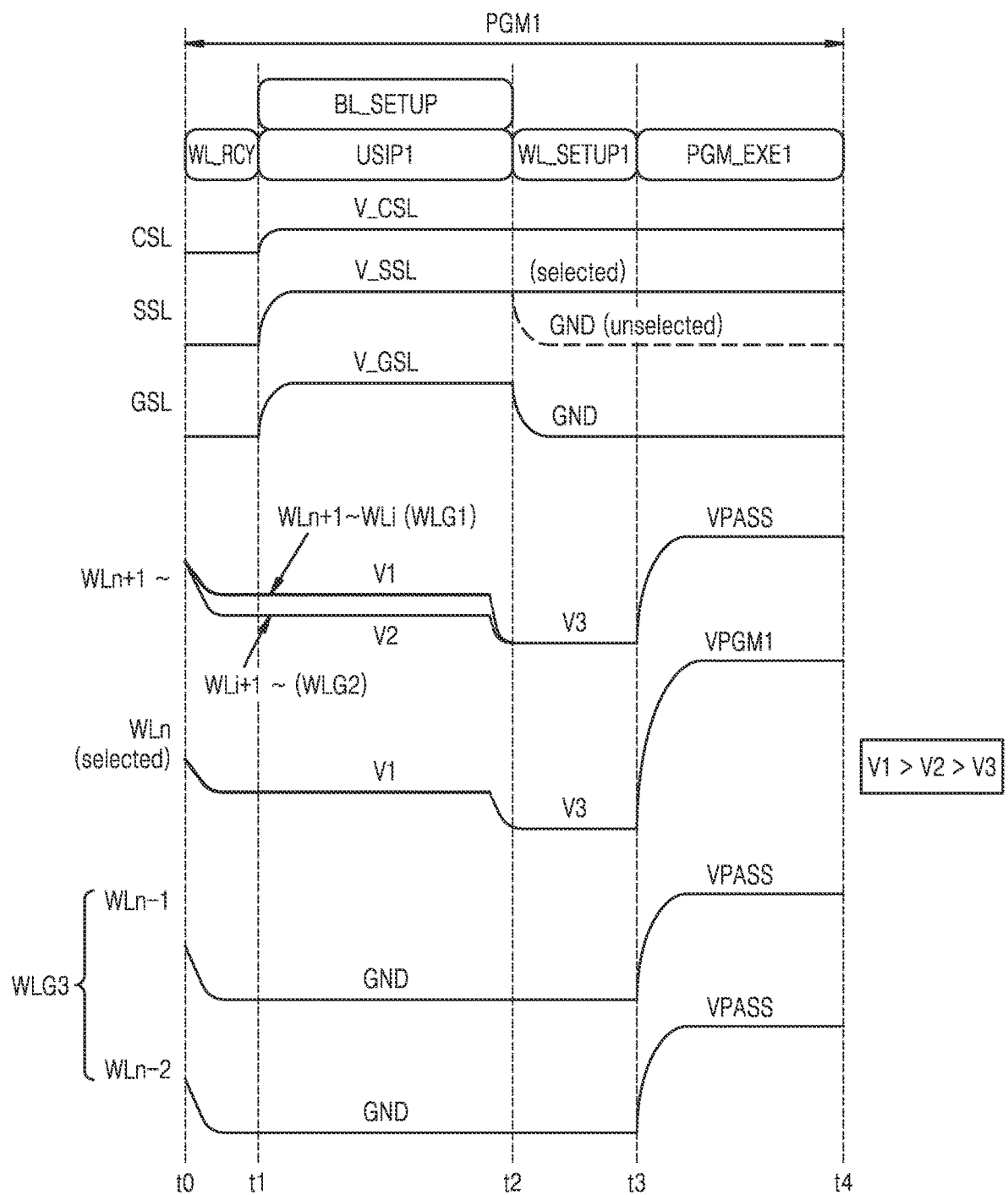
FIGS. 15 and 16 are respective timing diagrams illustrating a first program operation and a second program operation for a memory device according to embodiments of the inventive concept.
Figure 16:
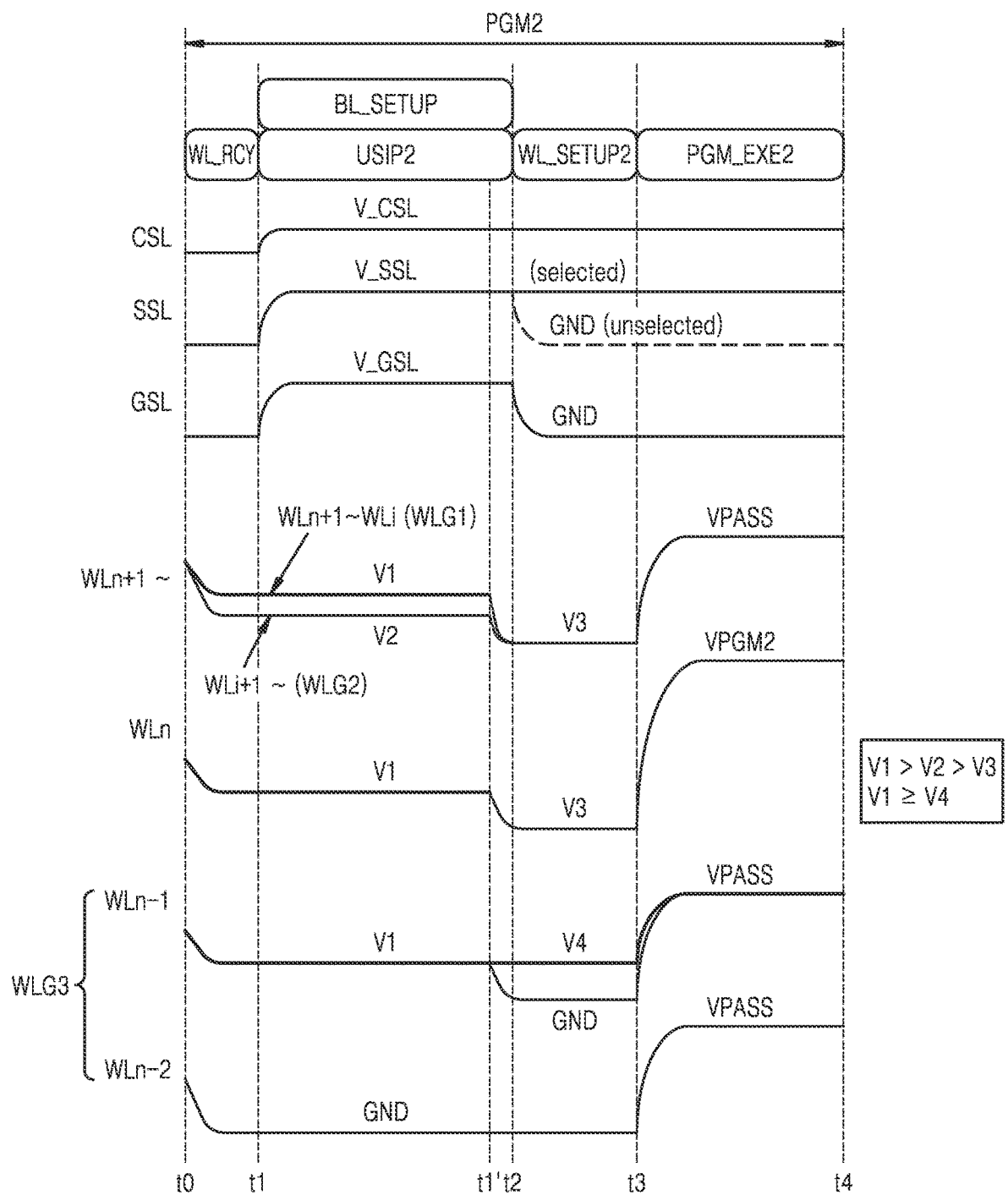

FIG. 14 is a flowchart illustrating a method of programming a memory device according to embodiments of the inventive concept, FIG. 15 is a timing diagram illustrating the first program operation PGM1 of the memory device according to embodiments of the inventive concept, and FIG. 16 is a timing diagram illustrating the second program operation PGM2 of the memory device according to embodiments of the inventive concept. Here, the embodiments of FIGS. 15 and 16 may be understood as modified examples of FIG. 10.

Referring to FIGS. 5, 15, 16 and 17, in (or during) a first channel initialization period USIP1, the first voltage V1 is applied to the selected word line WLn and the first word line group WLG1, and the second voltage V2 is applied to the second word line group WLG2 (S110). Here, the first voltage V1 may have a higher voltage level than that of the second voltage V2, and memory cells corresponding to the second word line group WLG2 may be turned ON. In some embodiments, the first word line group WLG1 may include at least one word line on which only the first program operation PGM1 is performed. In some embodiments, the first word line group WLG1 may include word lines on which both the first and second program operations PGM1 and PGM2 are performed. In some embodiments, the second word line group WLG2 may include word lines on which both the first and second program operations WLG1 and WLG2 are performed.

Here, during the first channel initialization period USIP1, ground voltage GND may be applied to the third word line group WLG3, and accordingly, a boosting potential of a channel corresponding to the third word line group WLG3 may be maximized. In some embodiments, the third word line group WLG3 may include word lines on which neither the first and second program operations PGM1 and PGM2 are performed. During the first channel initialization period USIP1, because a program operation has not yet been performed on the third word line group WLG3, memory cells connected to the third word line group WLG3 may be in an erase state. Accordingly, in the first channel initialization period USIP1, the first voltage V1 may not be applied to the third word line group WLG3.

During a first program execution period PGM_EXE1, a first program voltage VPGM1 is applied to the selected word line WLn (S130). Also, in the first program execution period PGM_EXE1, the pass voltage VPASS is applied to unselected word lines, that is, the first to third word line groups WLG1, WLG2, and WLG3. In some embodiments, in the first program execution period PGM_EXE1, the pass voltage VPASS may be first applied to the selected word line WLn, and then the first program voltage VPGM1 may be applied.

The first program operation PGM1 may be performed on the adjacent word line WLn−1 included in the third word line group WLG3 (S140).

During a second channel initialization period USIP2, the first voltage V1 is applied to the selected word line WLn, the first word line group WLG1, and the adjacent word line WLn−1, and the second voltage V2 is applied to the second word line group WLG2 (S160). Here, the first voltage V1 may be applied to the adjacent word line WLn−1 on which the first program operation PGM1 is performed among the word lines included in the third word line group WLG3, and ground voltage GND may be applied to the remaining word lines included in the group WLG3 (or the word line WLn−2 on which the first program operation PGM1 is not performed). Accordingly, memory cells corresponding to the second word line group WLG2 and memory cells corresponding to the adjacent word line WLn−1 may be turned ON. Accordingly, a channel potential difference between the selected word line WLn and the adjacent word lines WLn+1 to WLi may be reduced, and accordingly, negative boosting may be suppressed in a channel region corresponding to the adjacent word lines WLn+1 to WLi. Similarly, a channel potential difference between the selected word line WLn and the adjacent word line WLn−1 may be reduced, and accordingly, negative boosting may be suppressed in a channel region corresponding to the adjacent word line WLn−1.

During a second program execution period PGM_EXE2, the second program voltage VPGM2 is applied to the selected word line WL2 (S190). Also, during the second program execution period PGM_EXE2, the pass voltage VPASS may be applied to unselected word lines, that is, the first to third word line groups WLG1, WLG2, and WLG3. In some embodiments, during the second program execution period PGM_EXE2, the pass voltage VPASS may be first applied to the selected word line WLn, and then, the second program voltage VPGM2 may be applied.

Figure 17:
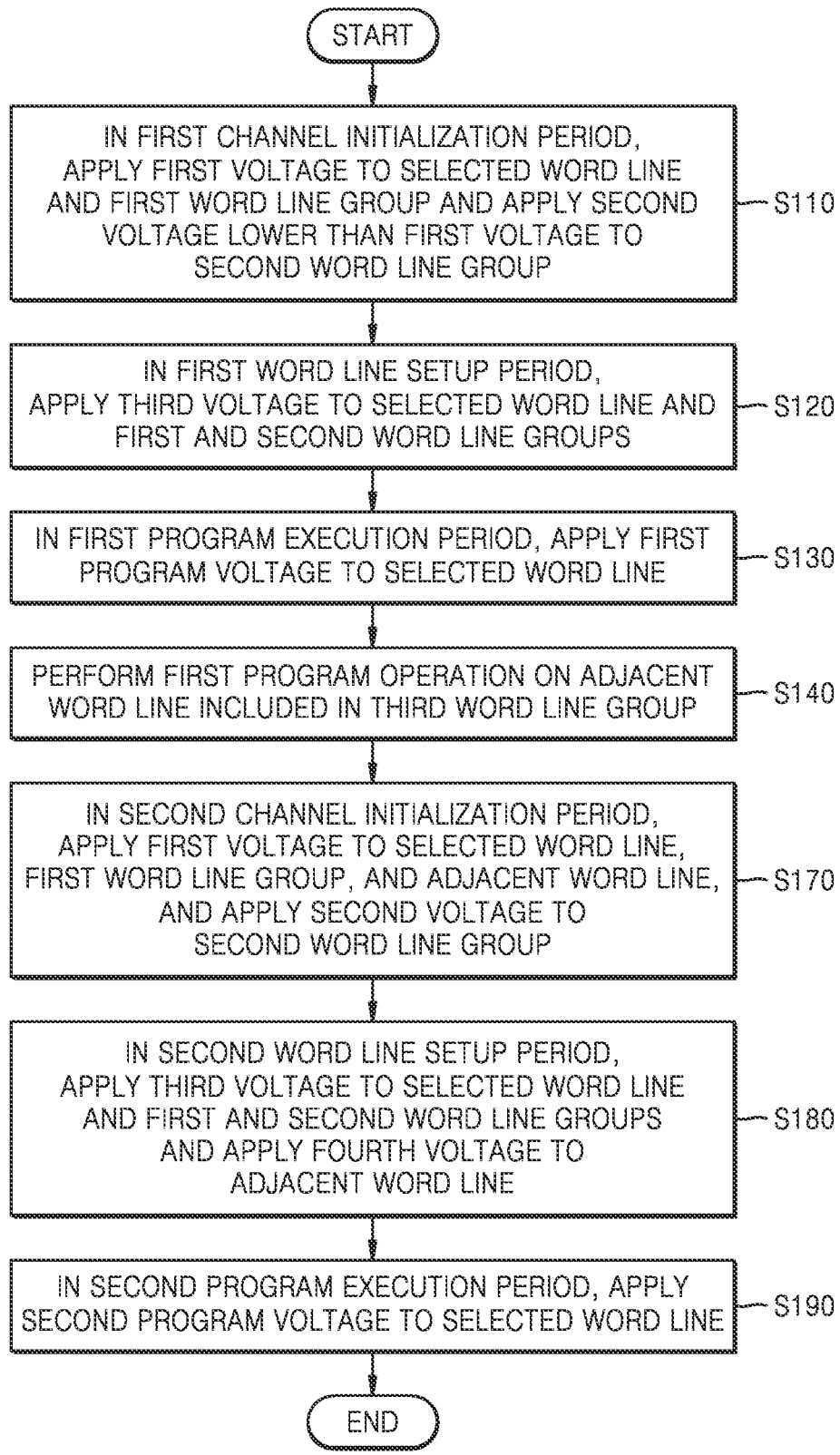
FIGS. 17 and 18 are respective flowcharts illustrating methods of programming a memory device according to embodiments of the inventive concept.

FIG. 17 is a flowchart illustrating a method of programming a memory device according to embodiments of the inventive concept, and may be understood in certain aspects as a modified example of the method of programming described in relation to FIG. 14.

Referring to FIG. 17, during (or in) the first channel initialization period USIP1, the first voltage V1 may be applied to the selected word line WLn and the first word line group WLG1, and the second voltage V2 may be applied to the second word line group WLG2 (S110).

During a first word line setup period WL_SETUP1 between the first channel initialization period USIP1 and the first program execution period PGM_EXE1, the third voltage V3 that is lower than the first and second voltages V1 and V2 may be applied to the selected word line WLn and the first and second word line groups WLG1 and WLG2 (S120).

During the first program execution period PGM_EXE1, the first program voltage VPGM1 may be applied to the selected word line WLn (S130).

A first program operation may be performed on the adjacent word line WLn−1 included in the third word line group WLG3 (S140).

During the second channel initialization period USIP2, the first voltage V1 may be applied to the selected word line WLn, the first word line group WLG1, and the adjacent word line WLn−1, and the second voltage V2 may be applied to the second word line group WLG2 (S170).

During a second word line setup period WL_SETUP2 between the second channel initialization period USIP2 and the second program execution period PGM_EXE2, the third voltage V3 that is lower than the first and second voltages V1 and V2 may be applied to the selected word line WLn and the first and second word line groups WLG1 and WLG2 (S180). Also, during the second word line setup period WL_SETUP2, a fourth voltage V4 that is lower than or equal to the first voltage V1 may be applied to the adjacent word line WLn−1 included in the third word line group WLG3. Accordingly, during the second word line setup period WL_SETUP2, memory cell corresponding to the adjacent word line WLn−1 may be turned ON, and negative boosting of some channels may be suppressed by reducing FN stress or an HCI. In addition, a boosting potential of a channel corresponding to the selected word line WLn may be maximized.

During the second program execution period PGM_EXE2, the second program voltage VPGM2 is applied to the selected word line WL2 (S190).

Figure 18:
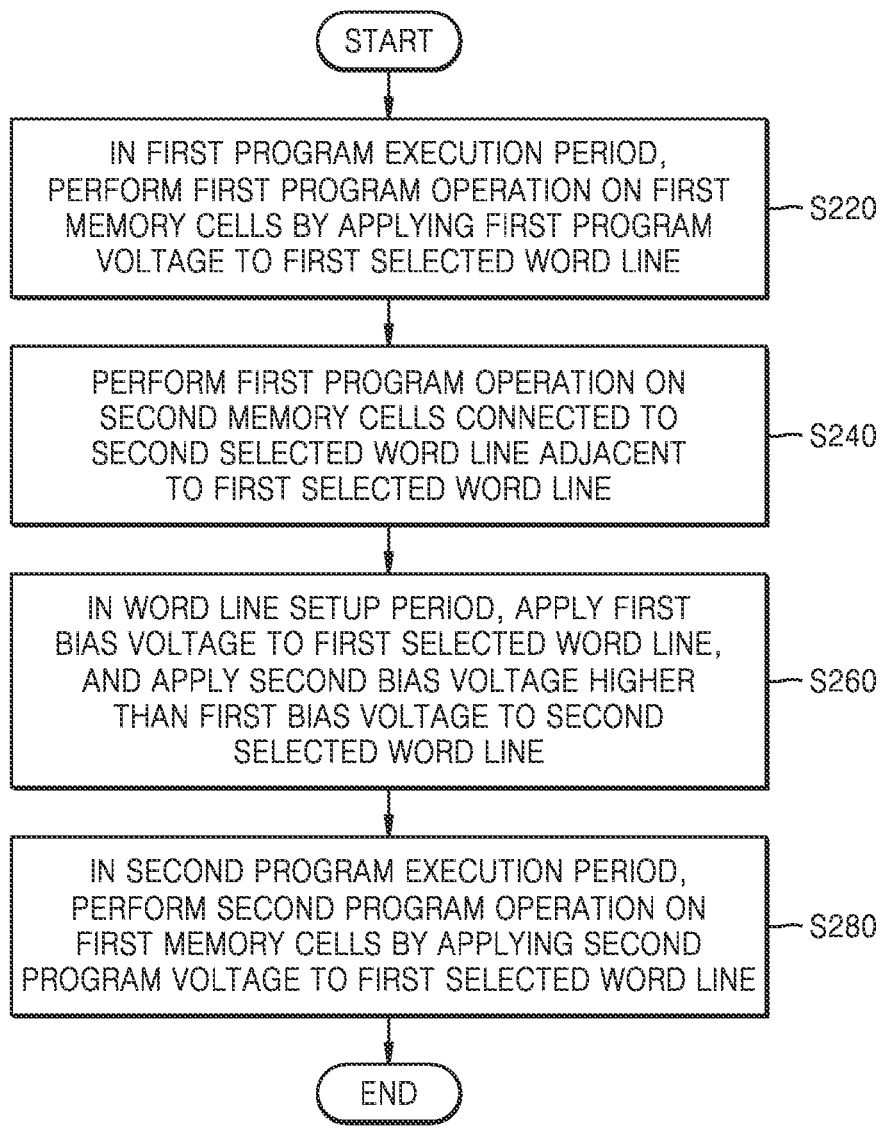
Figure 19A:
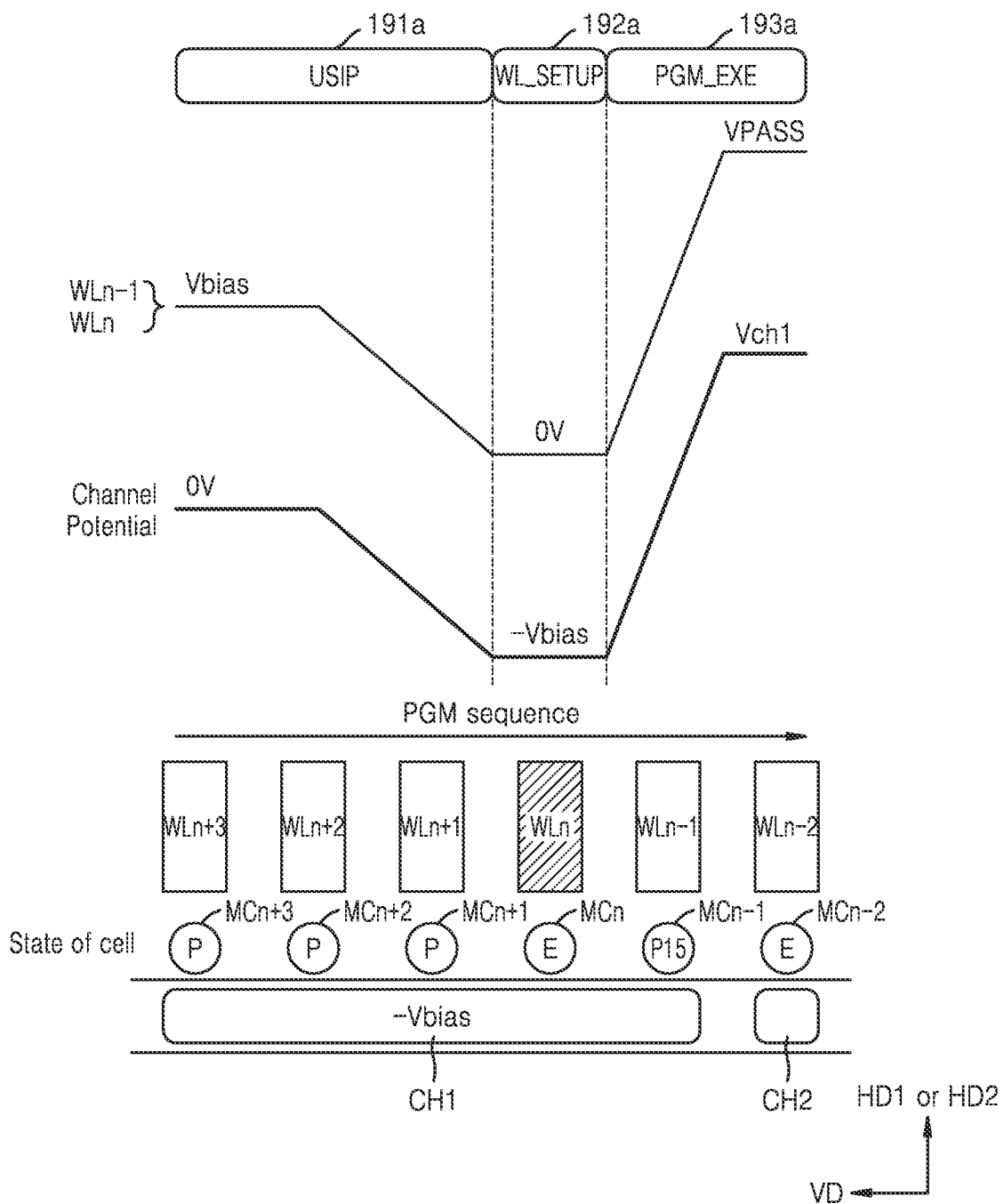
FIGS. 19A and 19B are respective, conceptual timing diagrams illustrating a second program operation on a first selected word line according to a comparative example, a second program operation on the first selected word line according to embodiments of the inventive concept.
Figure 19B:
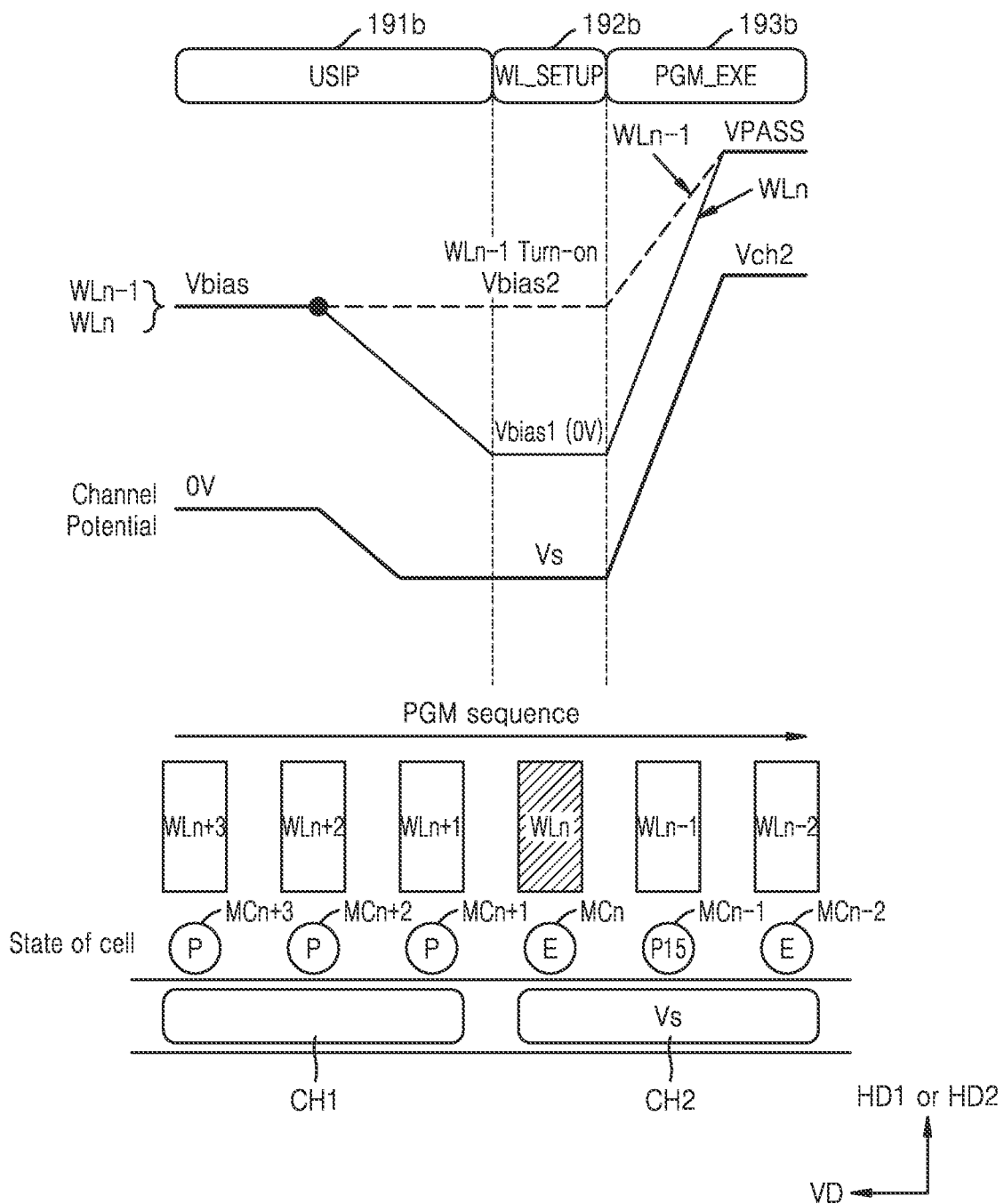

FIG. 18 is a flowchart illustrating a method of programming a memory device according to embodiments of the inventive concept. FIGS. 19A and 19B are respective, conceptual timing diagrams illustrating a second program operation on a first selected word line according to a comparative example, and the second program operation on the first selected word line according to embodiments of the inventive concept Referring to FIGS. 18 and 19B, during the first program execution period PGM_EXE1, a first program voltage may be applied to the first selected word line WLn, and thus, a first program operation may be performed on the first memory cells MCn connected to the first selected word line WLn (S220).

The first program operation may be performed on second memory cells MCn−1 connected to the second selected word line WLn−1 adjacent to the first selected word line WLn (S240).

During a word line setup period 192b, a first bias voltage Vbias1 may be applied to the first selected word line WLn, and a second bias voltage Vbias2 higher than the first bias voltage Vbias1 may be applied to the second selected word line WLn−1 (S260).

During a second program execution period 193b, a second program voltage may be applied to the first selected word line WLn, and thus, the second program operation may be performed on the first memory cells MCn connected to the first selected word line WLn (S280).

Referring to FIG. 19A, when a program operation is performed on a memory device in a T2B direction, the first program operation is performed on the second selected word line WLn−1, and then, the second program operation may be performed on the first selected word line WLn. In this regard, all of the first and second program operations on the word lines WLn+1 to WLn+3 disposed above the first selected word line WLn in the vertical direction VD may be completed. That is, the memory cells MCn+1 to MCn+2 respectively connected to the word lines WLn+1 to WLn+3 may be in a program complete state P.

And after the first program operation on the first selected word line WLn is complete, the first selected memory cell MCn connected to the first selected word line WLn may be in an erase state E, and after the first program operation on the second selected word line WLn−1 is complete, the second selected memory cell MCn−1 connected to the second selected word line WLn−1 may be in a higher program state than that of the first selected memory cell MCn. For example, the second selected memory cell MCn−1 may be in a fifteenth program state P15, and in this case, a threshold voltage of the second selected memory cell MCn−2 may be about 4.5 V.

During a channel initialization period 191a, a bias voltage Vbias may be applied to the first and second selected word lines WLn and WLn−1. In some embodiments, for example, the bias voltage Vbias may be about 2.6 V, and a channel potential may be about 0 V. During a word line setup period 192a, when 0 V is applied to the first and second selected word lines WLn and WLn−1, because a voltage level applied to the second selected word line WLn−1 is lower than that of the threshold voltage of the second selected memory cell MCn−1, the second selected memory cell MCn−1 may be turned OFF.

By local boosting according to the turning OFF of the second selected memory cell MCn−1, a channel region may be divided into a first channel CH1 and a second channel CH2, and a channel potential of the first channel CH1 corresponding to the first selected word line WLn may correspond to −Vbias (e.g., about −2.6 V). During a program execution period 193a, the pass voltage VPASS may be first applied to the first and second selected word lines WLn and WLn−1. Although not shown, a program voltage may be applied to the first selected word line WLn, and the pass voltage VPASS may be continuously applied to the second selected word line WLn−1. During the program execution period 193a, the channel potential may rise to a first channel voltage Vch1.

FIG. 19B is another conceptual timing diagram illustrating a second program operation on the first selected word line WLn according to embodiments of the inventive concept. Hereinafter, only material differences between the embodiments of FIGS. 19A and 19B will be emphasized.

Referring to FIG. 19B, during a channel initialization period 191b, the bias voltage Vbias may be applied to the first and second selected word lines WLn and WLn−1. For example, the bias voltage Vbias may be about 2.6 V, and the channel potential may be about 0 V. During a word line setup period 192b, a first bias voltage Vbias1, e.g., 0 V, may be applied to the first selected word line WLn, while a second bias voltage Vbias2 higher than the first bias voltage Vbias1 may be applied the second selected word line WLn−1. Here, the second bias voltage Vbias2 may correspond to a voltage level that turns on the second selected memory cell MCn−1 corresponding to the second selected word line WLn−1. For example, the second bias voltage Vbias2 may correspond to the bias voltage Vbias.

The second bias voltage Vbias2 applied to the second selected word line WLn−1 may be equal to or higher than the threshold voltage of the second selected memory cell MCn−1, and accordingly, the second selected memory cell MCn−1 may be turned ON. By the turning ON of the second selected memory cell MCn−1, a channel potential of the second channel CH2 corresponding to the first and second selected word lines WLn and WLn−1 may correspond to Vs. In this case, Vs may correspond to a value obtained by subtracting a threshold voltage Vth@P15 of the second selected memory cell MCn−1 from the second bias voltage Vbias2 applied to the second selected word line WLn−1 (i.e., Vs=Vbias2−Vth@P15). In this regard, the magnitude of Vs may be lower than that of Vbias.

For example, the second bias voltage Vbias2 may be 2.6 V, the threshold voltage Vth@P15 of the second selected memory cell MCn−1 may be 4.5 V, and Vs may be about −1.9 V. Accordingly, the channel potential during the word line setup period 192b may be higher than the channel potential during a word line setup period 192a of a comparative, conventional example. During the program execution period 193b, the channel potential may rise to the second channel voltage Vch2, and the second channel voltage Vch2 may be higher than the first channel voltage Vch1 as compared with a comparative, conventional example of the program execution period 193a.

Figure 20:
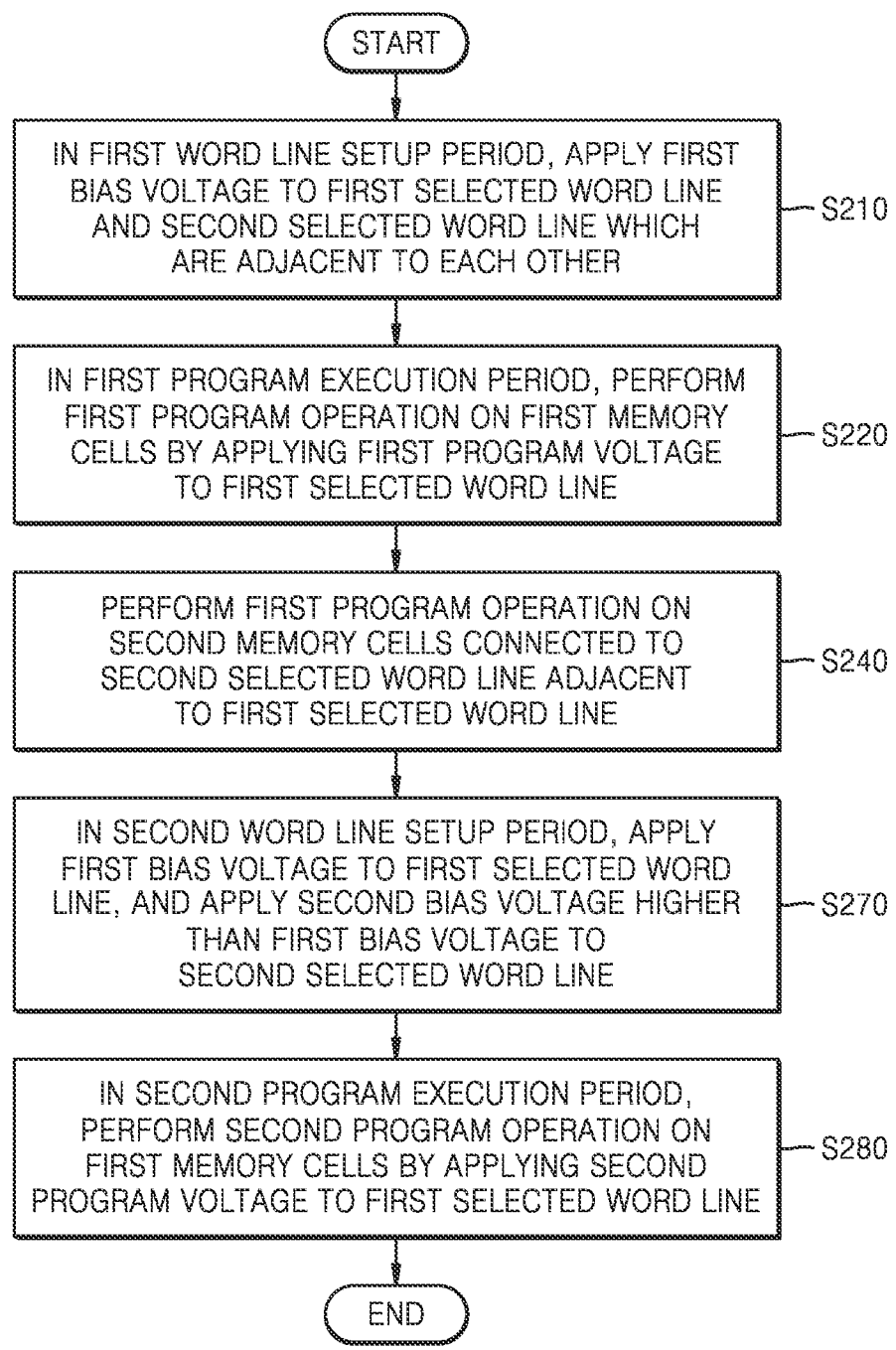
FIGS. 20 and 21 are respective flowcharts illustrating methods of programming a memory device according to embodiments of the inventive concept.

FIG. 20 is a flowchart illustrating a method of programming a memory device according to embodiments of the inventive concept.

Referring to FIG. 20, the first bias voltage Vbias1 may be applied to the first selected word line WLn and the second selected word line WLn−1 which are adjacent to each other in a first word line setup period (S210).

During a first program execution period, a first program voltage may be applied to the first selected word line WLn to perform a first program on the first memory cells MCn connected to the first selected word line WLn (S220).

A first program operation may be performed on the second memory cells MCn−1 connected to the second selected word line WLn−1 adjacent to the first selected word line WLn (S240).

During the second word line setup period 192b, the first bias voltage Vbias1 may be applied to the first selected word line WLn, and the second bias voltage Vbias2 higher than the first bias voltage Vbias1 may be applied to the second selected word line WLn−1 (S270).

Then, during the second program execution period 193b, a second program voltage may be applied to the first selected word line WLn to perform a second program on the first memory cells MCn connected to the first selected word line WLn (S280).

Figure 21:
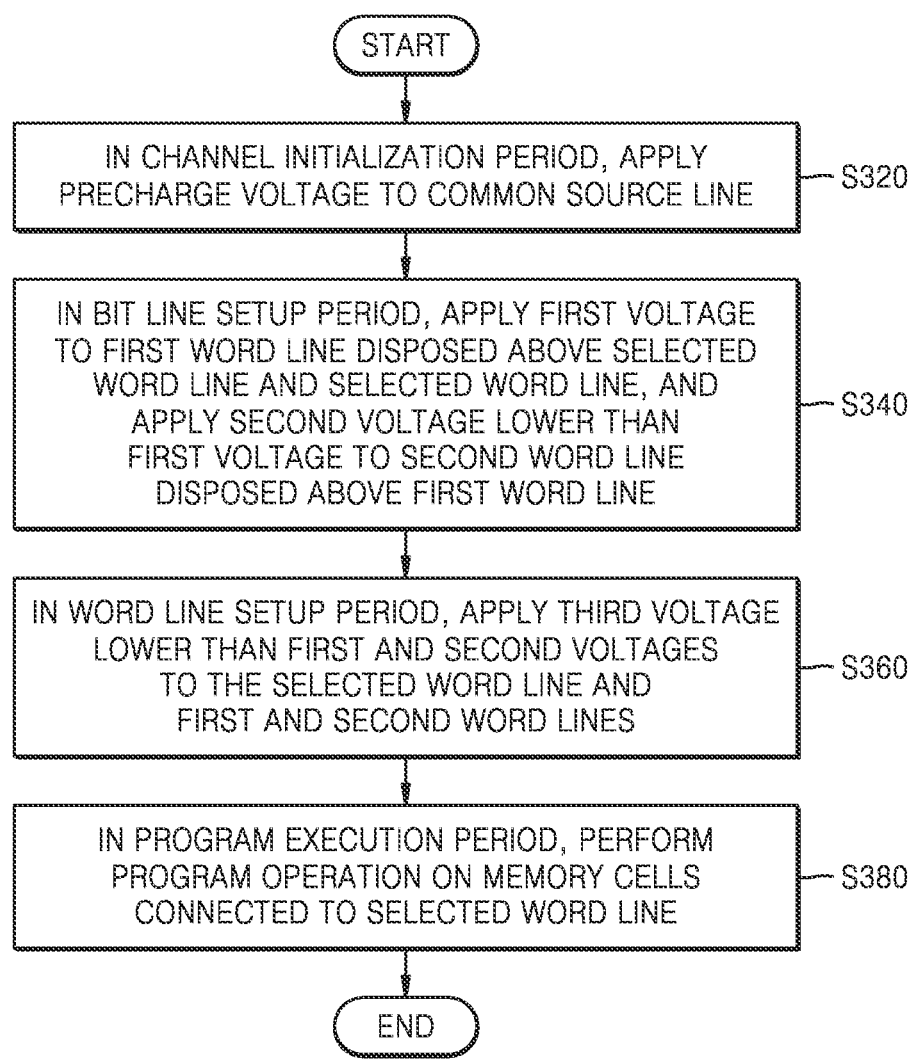
Figure 22:
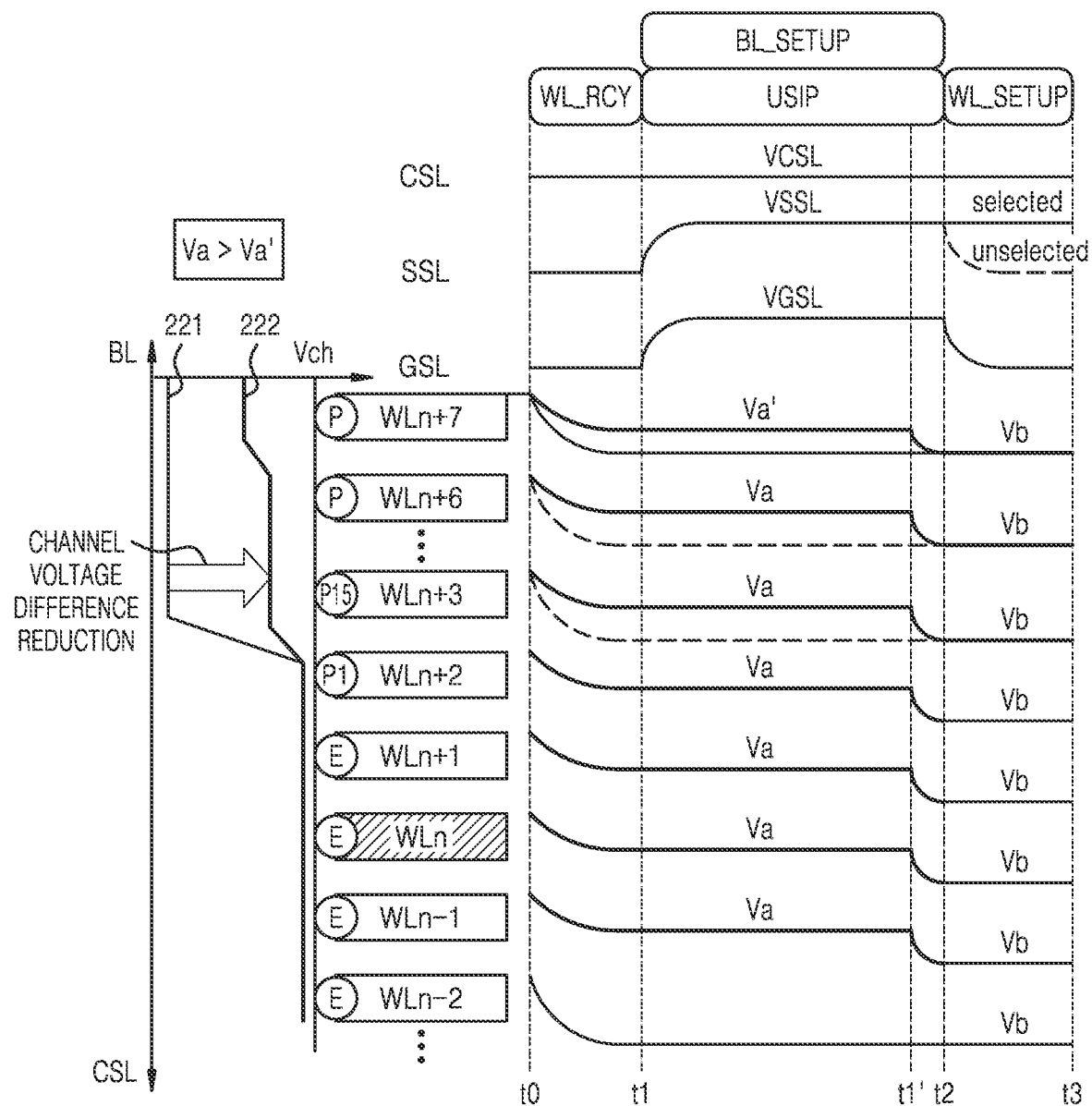
FIG. 22 is a timing diagram illustrating a program operation of a memory device according to embodiments of the inventive concept.

FIG. 21 is a flowchart illustrating a method of programming a memory device according to embodiments of the inventive concept, and FIG. 22 is a timing diagram further illustrating a program operation performed by a memory device according to embodiments of the inventive concept.

Referring to FIGS. 21 and 22, during (or in) a channel initialization period USIP, the common source line voltage VCSL corresponding to a precharge voltage may be applied to the common source line CSL (S320).

During the bit line setup period BL_SETUP, a first voltage Va may be applied to the first word line WLn+1 disposed above the selected word line WLn and the selected word line WLn, and, a second voltage Va' lower than the first voltage Va may be applied to a second word line WLn+7 disposed above the first word line WLn+1 (S340). As described above, the same first voltage Va as that of the selected word line WLn may be applied to word lines adjacent to the selected word line WLn, such as the first word line WLn+1, thereby reducing a channel voltage difference. Accordingly, negative boosting may be suppressed in some channels around the selected word line WLn.

During the word line setup period WL_SETUP, a third voltage Vb lower than the first and second voltages may be applied to the selected word line WLn and the first and second word lines WLn+1 and WLn+7 (S360). For example, the third voltage Vb may correspond to ground voltage, but the inventive concept is not limited thereto.

During a program execution period, a program operation may be performed on memory cells connected to the selected word line WLn (S380).

Figure 23:
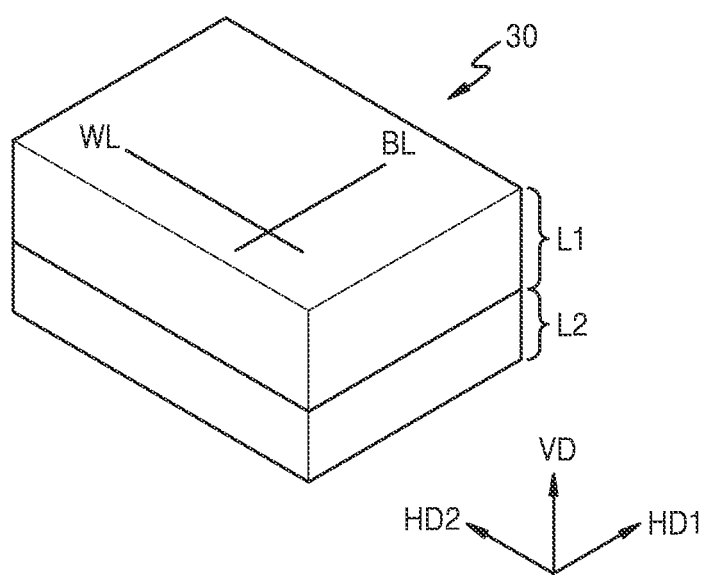
FIG. 23 is a perspective diagram illustrating a memory device having a cell over peri (COP) structure according to embodiments of the inventive concept.

FIG. 23 is a perspective diagram illustrating a memory device 30 having a cell-over-peri (COP) structure as one possible implementation example of the memory device 100 of FIG. 2 according to embodiments of the inventive concept.

Referring to FIGS. 1, 2 and 23, the memory device 30 may include a first semiconductor layer L1 and a second semiconductor layer L2, wherein the first semiconductor layer L1 may be vertically stacked on a second semiconductor layer L2. That is, the second semiconductor layer L2 may be disposed below the first semiconductor layer L1 in the vertical direction VD.

In some embodiments, the memory cell array 110 may be formed on the first semiconductor layer L1, and the control logic circuit 120, the page buffer circuit 130, the voltage generator 140, and the row decoder 150 may be formed in the second semiconductor layer L2. Accordingly, the memory device 30 may have a structure, that is, the COP structure, in which the memory cell array 110 is disposed above some peripheral circuits. The COP structure may effectively reduce a horizontal footprint (e.g., an occupying physical area) and improve a degree of device integration within the memory device 30.

In some embodiments, the second semiconductor layer L2 may include a substrate, and form semiconductor devices such as transistors and patterns for wiring the devices on the substrate to form circuits in the second semiconductor layer L2. After the circuits are formed in the second semiconductor layer L2, the first semiconductor layer L1 including the memory cell array 110 may be formed, and patterns for electrically connecting the word lines WL and the bit lines BL of the memory cell array 110 and the circuits formed in the second semiconductor layer L2 may be formed.

Figure 24:
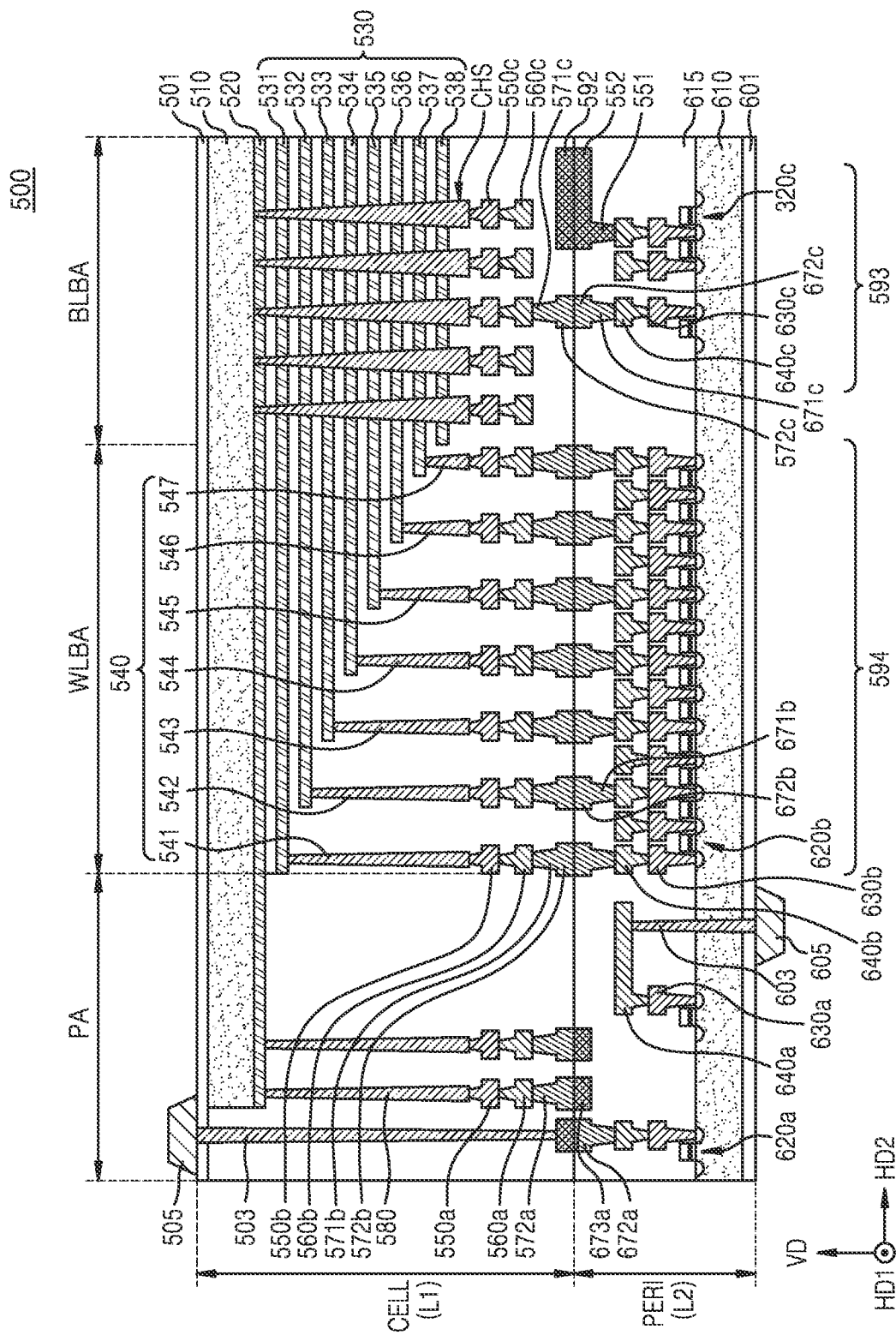
FIG. 24 is a cross-sectional view illustrating a memory device having a bonding vertical NAND (B-VNAND) structure according to embodiments of the inventive concept.

FIG. 24 is a cross-sectional view illustrating a memory device 500 having a bonding vertical NAND (B-VNAND) structure according to embodiments of the inventive concept. When a non-volatile memory included in the memory device 500 is implemented as a B-VNAND type flash memory, the non-volatile memory may have the structure similar to that of FIG. 24.

Referring to FIG. 24, a cell region CELL of the memory device 500 may correspond to the first semiconductor layer L1, and a peripheral circuit region PERI may correspond to the second semiconductor layer L2. Each of the peripheral circuit region PERI and the cell region CELL of the memory device 500 may include an external pad bonding area PA, a word line bonding area WLBA, and a bit line bonding area BLBA. For example, the plurality of word lines WL, the plurality of string select lines SSL, the plurality of ground select lines GSL, and the memory cell array 110 of FIG. 2 may be formed in the first semiconductor layer L1, and the control logic circuit 120, the page buffer circuit 130, the voltage generator 140, and the row decoder 150 may be formed in the second semiconductor layer L2.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. In an example embodiment, the first metal layers 630a, 630b, and 630c may be formed of tungsten having relatively high resistivity, and the second metal layers 640a, 640b, and 640c may be formed of copper having relatively low resistivity.

In some embodiments, although only the first metal layers 630a, 630b, and 630c and the second metal layers 640a, 640b, and 640c are shown and described, the inventive concept is not limited thereto, and one or more additional metal layers may be formed on the second metal layers 640a, 640b, and 640c. At least a portion of the one or more additional metal layers formed on the second metal layers 640a, 640b, and 640c may be formed of aluminum etc. having a lower resistivity than those of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material, such as silicon oxide, silicon nitride, etc.

Lower bonding metals 671b and 672b may be formed on the second metal layer 640b in the word line bonding area WLBA. In the word line bonding area WLBA, the lower bonding metals 671b and 672b in the peripheral circuit region PERI may be electrically bonded to upper bonding metals 571b and 572b of the cell region CELL. The lower bonding metals 671b and 672b and the upper bonding metals 571b and 572b may be formed of aluminum, copper, tungsten, etc. Further, the upper bonding metals 571b and 572b in the cell region CELL may be referred as first metal pads and the lower bonding metals 5271b and 5272b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in the vertical direction VD, perpendicular to the upper surface of the second substrate 510, and pass through the plurality of word lines 530, the at least one string select line, and the at least one ground select line. The channel structure CH may include a data storage layer, a channel layer, a buried insulating layer, etc., and the channel layer may be electrically connected to a first metal layer 550c and a second metal layer 560c. For example, the first metal layer 550c may be a bit line contact, and the second metal layer 560c may be a bit line. In an example embodiment, the bit line 560c may extend in a second horizontal direction HD2, parallel to the upper surface of the second substrate 510.

In some embodiments, an area in which the channel structure CH, the bit line 560c, etc. are disposed may be defined as the bit line bonding area BLBA. In the bit line bonding area BLBA, the bit line 560c may be electrically connected to the circuit elements 620c providing a page buffer 593 in the peripheral circuit region PERI. The bit line 560c may be connected to upper bonding metals 571c and 572c in the cell region CELL, and the upper bonding metals 571c and 572c may be connected to lower bonding metals 671c and 672c connected to the circuit elements 620c of the page buffer 593.

In the word line bonding area WLBA, the plurality of word lines 530 may extend in a first horizontal direction HD1, parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second horizontal direction HD2. A first metal layer 550b and a second metal layer 560b may be connected to an upper portion of the plurality of cell contact plugs 540 connected to the plurality of word lines 530, sequentially. The plurality of cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The plurality of cell contact plugs 540 may be electrically connected to the circuit elements 620b providing a row decoder 594 in the peripheral circuit region PERI. In an example embodiment, operating voltages of the circuit elements 620b of the row decoder 594 may be different than operating voltages of the circuit elements 620c providing the page buffer 593. For example, operating voltages of the circuit elements 620c providing the page buffer 593 may be higher than operating voltages of the circuit elements 620b providing the row decoder 594.

A common source line contact plug 580 may be disposed in the external pad bonding area PA. The common source line contact plug 580 may be formed of a conductive material, such as a metal, a metal compound, polysilicon, etc., and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

I/O pads 605 and 505 may be disposed in the external pad bonding area PA. A lower insulating film 601 covering a lower surface of the first substrate 610 may be formed below the first substrate 610, and a first I/O pad 605 may be formed on the lower insulating film 601. The first I/O pad 605 may be connected to at least one of the plurality of circuit elements 620a, 620b, and 620c disposed in the peripheral circuit region PERI through a first I/O contact plug 603, and may be separated from the first substrate 610 by the lower insulating film 601. In addition, a side insulating film may be disposed between the first I/O contact plug 603 and the first substrate 610 to electrically separate the first I/O contact plug 603 and the first substrate 610.

An upper insulating film 501 covering the upper surface of the second substrate 510 may be formed on the second substrate 510, and a second I/O pad 505 may be disposed on the upper insulating layer 501. The second I/O pad 505 may be connected to at least one of the plurality of circuit elements 620a, 620b, and 620c disposed in the peripheral circuit region PERI through a second I/O contact plug 503.

According to embodiments, the second substrate 510 and the common source line 520 may not be disposed in an area in which the second I/O contact plug 503 is disposed. Also, the second I/O pad 505 may not overlap the word lines 530 in the vertical direction VD. The second I/O contact plug 503 may be separated from the second substrate 510 in a direction, parallel to the upper surface of the second substrate 510, and may pass through an interlayer insulating layer of the cell region CELL to be connected to the second I/O pad 505.

According to embodiments, the first I/O pad 605 and the second I/O pad 505 may be selectively formed. For example, the memory device 400 may include only the first I/O pad 605 disposed on the first substrate 610 or the second I/O pad 505 disposed on the second substrate 510. Alternatively, the memory device 400 may include both the first I/O pad 605 and the second I/O pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

Figure 25:
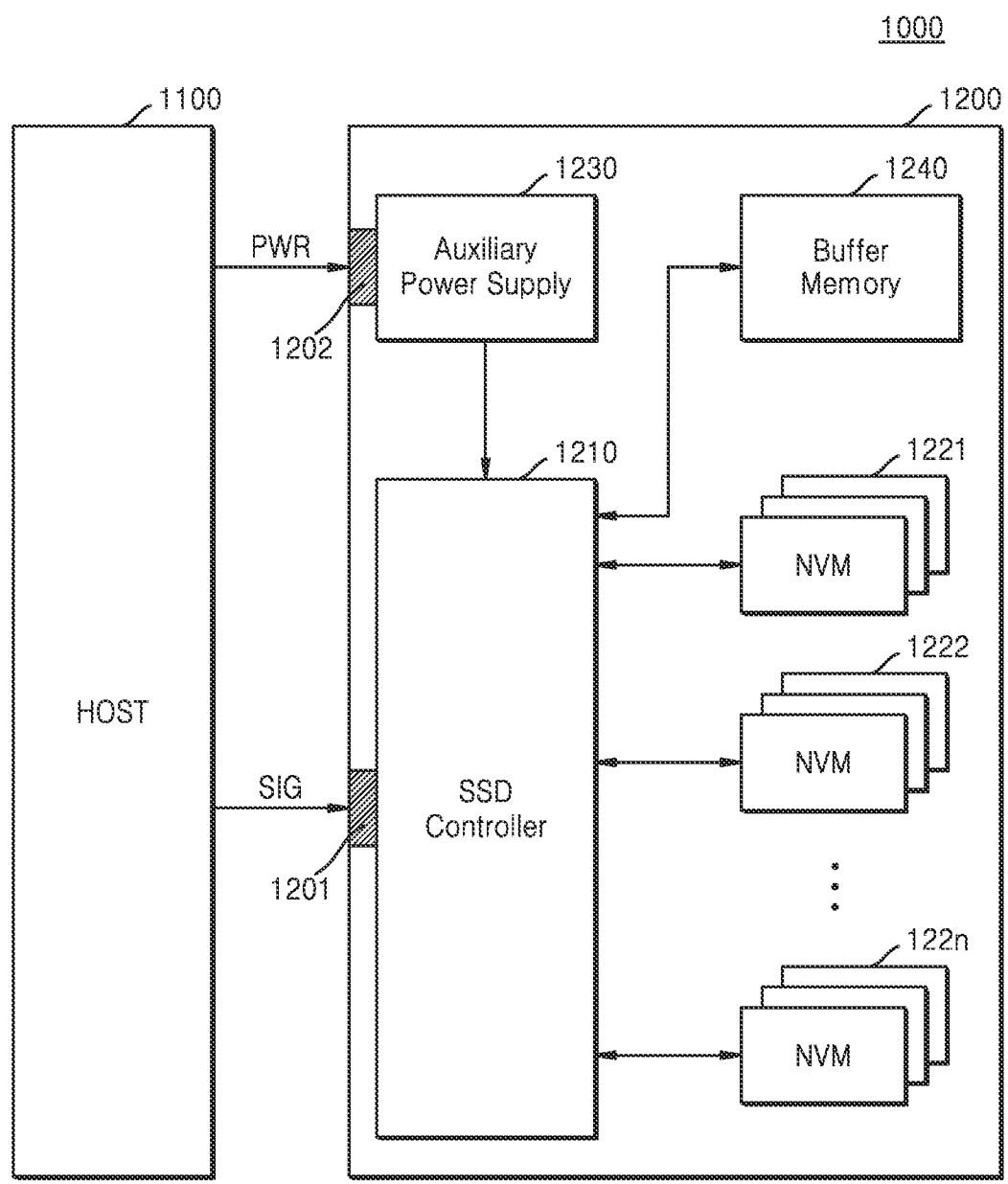
FIG. 25 is a block diagram illustrating a solid state drive (SSD) system to which a memory device according to an embodiment of the inventive concept may be applied.

FIG. 25 is a block diagram illustrating a solid state drive (SSD) system 1000 to which a memory device according to embodiments of the inventive concept may be applied.

Referring to FIG. 25, the SSD system 1000 may include a host 1100 and an SSD 1200. The SSD 1200 transmits and receives signals to and from the host 1100 through a signal connector, and receives power through a power connector. The SSD 1200 may include an SSD controller 1210, an auxiliary power supply 1220, and memory devices 1230, 1240, and 1250. The memory devices 1230, 1240, and 1250 may be vertical stack type NAND flash memory devices. In this regard, the SSD 1200 may be implemented using, for example, one of the embodiments described above in relation to FIGS. 1 to 24, inclusive.

While the inventive concept has been particularly shown and described with reference to embodiments thereof, it will be understood that various changes in form and details may be made therein without departing from the spirit and scope of the following claims.

What is claimed is:

1. A method of programming a non-volatile memory device, the method comprising:
   during a first channel initialization period, applying a first voltage to a selected word line and a first word line group proximate to the selected word line, and applying a second voltage lower than the first voltage to a second word line group distal from the selected word line, wherein a program operation is performed on the first word line group and the second word line group before the first channel initialization period;
   applying a first program voltage to the selected word line during a first program execution period in order to perform a first program operation for data;
   during a second channel initialization period, applying the first voltage to the selected word line and the first word line group, and applying the second voltage to the second word line group;
   applying a second program voltage to the selected word line during a second program execution period in order to perform a second program operation for the data;

performing the program operation on an adjacent word line included in a third word line group between the first program execution period and the second channel initialization period; and applying the first voltage to the adjacent word line during the second channel initialization period, wherein the second channel initialization period follows the program operation on the adjacent word line.

2. The method of claim 1, wherein the selected word line is disposed between the third word line group and the first word line group, the first word line group is disposed above the selected word line, and the second word line group is disposed above the first word line group.

3. The method of claim 2, further comprising:
applying ground voltage to the first word line group during the first channel initialization period; and
applying ground voltage to at least one word line other than the adjacent word line in the first word line group, in the second channel initialization period.

4. The method of claim 2, further comprising:
during a word line setup period between the second channel initialization period and the second program execution period, applying a third voltage lower than the second voltage to the first word line group, the second word line group and the selected word line, and
applying a fourth voltage equal to or lower than the first voltage to the adjacent word line.

5. The method of claim 4, wherein during the word line setup period, a program operation on memory cells connected to the first word line group and the second word line group is completed, and a program operation on a memory cell connected to the adjacent word line is not completed.

6. The method of claim 1, further comprising:
during a word line setup period between the first channel initialization period and the first program execution period, applying a third voltage lower than the first voltage and lower than the second voltage to the first word line group, the second word line group and the selected word line.

7. The method of claim 6, wherein the third voltage is ground voltage.

8. The method of claim 1, wherein a program operation programming data to a memory cell connected to the selected word line is completed by the first program operation and the second program operation,
the memory cell is programmed from an erase state to one of N program states by the first program operation, N being a positive integer, and
the second program operation is a reprogram operation.

9. The method of claim 1, wherein a program operation programming data to a memory cell connected to the selected word line is completed by the first program operation and the second program operation,
the memory cell is programmed from an erase state to one of M program states by the first program operation, M being a positive integer, and thereafter, and
the memory cell is programmed from the one of M program states to one of N program states by the second program operation, N being a positive integer greater than M.

10. The method of claim 1, wherein the second word line group is disposed on an upper portion of a substrate, the first word line group is disposed on an upper portion of the second word line group, the selected word line is disposed on an upper portion of the first word line group, and a third word line group is disposed above the selected word line, and
the method further comprises:
performing a program operation on an adjacent word line included in the third word line group between the first program execution period and the second channel initialization period.

11. The method of claim 1, wherein during each of the first channel initialization period and the second channel initialization period, a precharge voltage is applied to a common source line, a bit line program voltage is applied to a selected bit line, and a bit line program inhibit voltage is applied to an unselected bit line.

12. The method of claim 1, wherein a program operation programming data to a memory cell connected to the selected word line is completed by the first program operation and the second program operation.

13. The method of claim 1, wherein the non-volatile memory device includes a first memory stack on a substrate and a second memory stack vertically stacked on the first memory stack,
the selected word line, the first word line group, and the second word line group are connected to at least one of the first memory stack and the second memory stack,
during the first channel initialization period and the second channel initialization period, a same voltage is applied to word lines connected to the second memory stack, and
during the first channel initialization period and the second channel initialization period, a same voltage is applied to word lines connected to the first memory stack.

* * * * *